US012652988B2

(12) United States Patent
Goeckeritz

(10) Patent No.: US 12,652,988 B2
(45) Date of Patent: Jun. 9, 2026

(54) THERMALLY GUIDED CHEMICAL ETCHING OF A SUBSTRATE AND REAL-TIME MONITORING THEREOF

(71) Applicant: Momentum Optics LLC, Longmont, CO (US)

(72) Inventor: Jeremy Goeckeritz, Longmont, CO (US)

(73) Assignee: Momentum Optics, Longmont, CO (US)

( * ) Notice: Subject to any disclaimer, the term of this patent is extended or adjusted under 35 U.S.C. 154(b) by 327 days.

(21) Appl. No.: 17/728,467

(22) Filed: Apr. 25, 2022

(65) Prior Publication Data

US 2022/0252529 A1     Aug. 11, 2022

Related U.S. Application Data

(63) Continuation of application No. 16/823,552, filed on Mar. 19, 2020, now Pat. No. 11,313,813.

(Continued)

(51) Int. Cl.
| | |
|---|---|
| *C03C 15/00* | (2006.01) |
| *C04B 41/53* | (2006.01) |
| *C04B 41/91* | (2006.01) |
| *H10P 72/00* | (2026.01) |
| *G01N 23/06* | (2018.01) |
| *G02B 3/00* | (2006.01) |
| *G02B 5/08* | (2006.01) |

(52) U.S. Cl.
CPC .......... *H10P 72/0422* (2026.01); *C03C 15/00* (2013.01); *C04B 41/5346* (2013.01); *C04B 41/91* (2013.01); *H10P 72/0426* (2026.01); *G01N 23/06* (2013.01); *G02B 3/00* (2013.01); *G02B 5/08* (2013.01)

(58) Field of Classification Search
CPC ......... H01L 21/67075; H01L 21/67086; H10P 72/0426; H10P 72/0422
See application file for complete search history.

(56) References Cited

U.S. PATENT DOCUMENTS

| | | | |
|---|---|---|---|
| 5,164,324 A | 11/1992 | Russell et al. | |
| 5,919,336 A * | 7/1999 | Kikuchi ............ | H01J 37/32357 |
| | | | 438/723 |

(Continued)

OTHER PUBLICATIONS

Howell et al. "Thermal Radiation Heat Transfer (5th Edition)" 2010, Taylor & Francis, p. 485-490 (Year: 2010).*

*Primary Examiner* — Karla A Moore
*Assistant Examiner* — Margaret Klunk
(74) *Attorney, Agent, or Firm* — Kunzler Needham Hilton

(57)     ABSTRACT

A method of controlling a substrate etching process includes disposing a bottom surface or a top surface of a substrate adjacent to volume of etching fluid to produce an etchant-substrate interface and heating the etchant-substrate interface via spatially controlled electromagnetic radiation. The method also includes transmitting a monitoring beam through the substrate, the substrate and volume of etching fluid being at least partially transparent at the wavelength range of the monitoring beam and measuring a property of the substrate surface during the substrate etching process via the monitoring beam to produce a real-time measured property for the substrate. A corresponding etching system and computer-program product is also disclosed herein.

20 Claims, 14 Drawing Sheets

Related U.S. Application Data

(60) Provisional application No. 62/820,754, filed on Mar. 19, 2019.

(56) References Cited

U.S. PATENT DOCUMENTS

| | | | |
|---|---|---|---|
| 6,057,525 A | 5/2000 | Chang et al. | |
| 6,130,419 A | 10/2000 | Neal | |
| 6,333,486 B1 | 12/2001 | Troitski | |
| 6,390,019 B1 | 5/2002 | Grimbergen et al. | |
| 6,563,079 B1 | 5/2003 | Umetsu et al. | |
| 6,849,823 B2 | 2/2005 | Edme et al. | |
| 7,354,526 B2 | 4/2008 | Hidaka et al. | |
| 7,823,595 B2 | 11/2010 | Takechi | |
| 8,049,138 B2 | 11/2011 | Yamada et al. | |
| 8,307,672 B2 | 11/2012 | Hidaka et al. | |
| 8,790,534 B2 | 7/2014 | Huff | |
| 8,908,161 B2 | 12/2014 | Krusor et al. | |
| 9,090,499 B2 | 7/2015 | Hong et al. | |
| 9,598,310 B2 | 3/2017 | Lee et al. | |
| 9,640,370 B2 | 5/2017 | Ansell | |
| 2003/0160025 A1 | 8/2003 | Rushford | |
| 2005/0009374 A1* | 1/2005 | Gao | H01L 21/3063 |
| | | | 257/E21.216 |
| 2006/0107976 A1* | 5/2006 | Boyers | H10P 70/273 |
| | | | 257/E21.255 |
| 2007/0108166 A1 | 5/2007 | Jennings et al. | |
| 2008/0169282 A1* | 7/2008 | Sorabji | H01L 21/67248 |
| | | | 219/448.11 |
| 2009/0013724 A1 | 1/2009 | Koyo et al. | |
| 2009/0274454 A1* | 11/2009 | Aderhold | H01L 22/26 |
| | | | 219/442 |
| 2009/0316749 A1* | 12/2009 | Davis | G01J 5/0003 |
| | | | 374/E1.001 |
| 2010/0002950 A1* | 1/2010 | Arieli | G01B 11/24 |
| | | | 702/167 |
| 2010/0192978 A1* | 8/2010 | Plavidal | H10P 70/20 |
| | | | 134/21 |
| 2010/0197116 A1 | 8/2010 | Shah et al. | |
| 2011/0292373 A1* | 12/2011 | Witting | G01N 21/59 |
| | | | 356/51 |
| 2012/0208377 A1* | 8/2012 | Timans | H01L 21/67115 |
| | | | 257/E21.333 |
| 2012/0270342 A1* | 10/2012 | Chumakov | H01L 22/26 |
| | | | 356/625 |
| 2013/0052758 A1* | 2/2013 | Krusor | H01L 22/12 |
| | | | 257/E21.53 |
| 2014/0106477 A1 | 4/2014 | Chen et al. | |
| 2014/0147624 A1 | 5/2014 | Streltsov et al. | |
| 2014/0251947 A1* | 9/2014 | Hong | C03C 15/00 |
| | | | 216/13 |
| 2014/0355630 A1* | 12/2014 | Takahashi | G02B 6/1225 |
| | | | 264/1.24 |
| 2015/0092813 A1* | 4/2015 | Timans | G01J 5/0896 |
| | | | 374/45 |
| 2016/0013079 A1 | 1/2016 | Choi et al. | |
| 2016/0118265 A1 | 4/2016 | Goddard et al. | |
| 2016/0334326 A1 | 11/2016 | Sapiens et al. | |
| 2017/0221730 A1* | 8/2017 | Jung | H01L 21/6708 |
| 2020/0353566 A1 | 11/2020 | Baur et al. | |

* cited by examiner

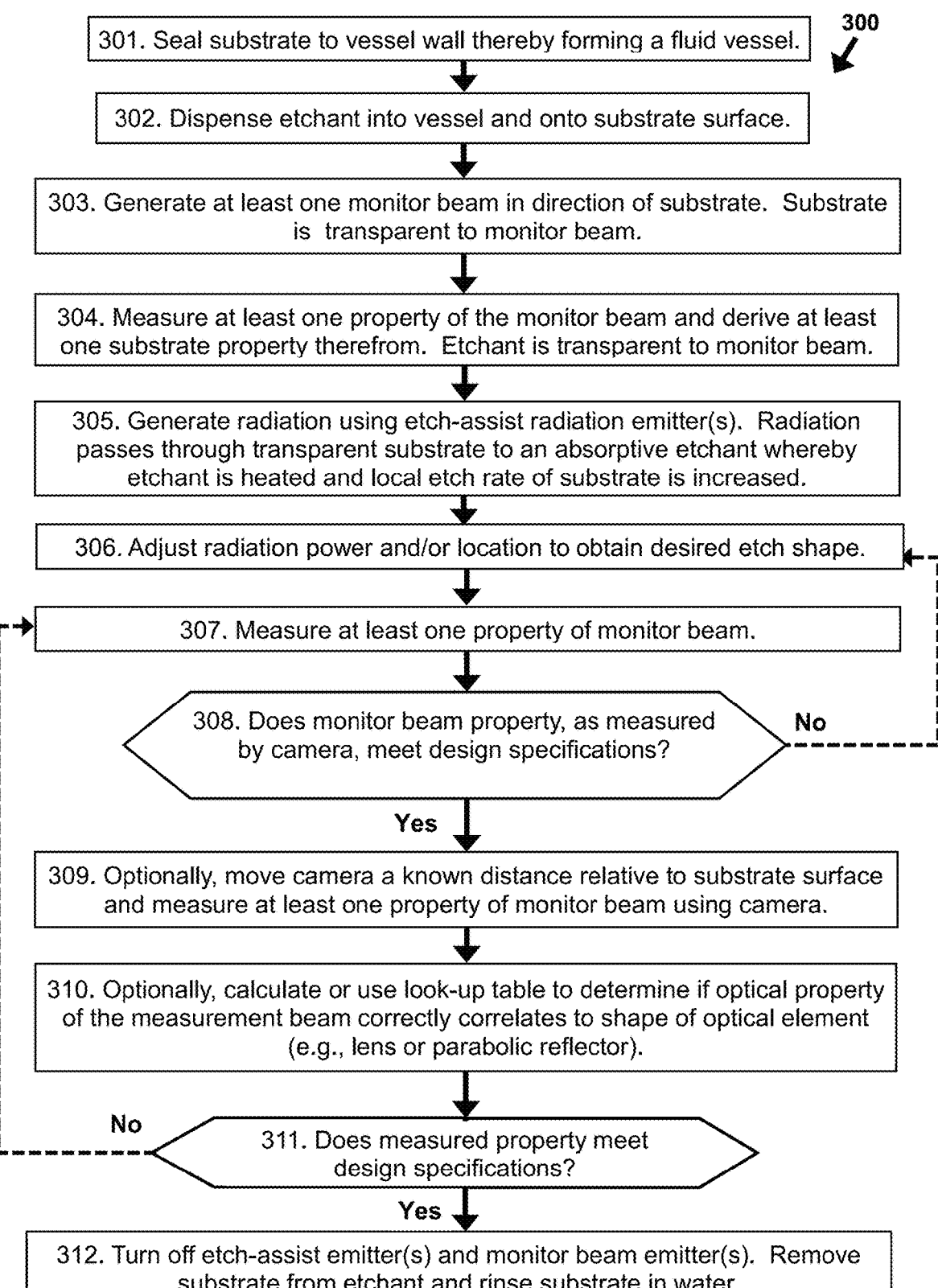

301. Seal substrate to vessel wall thereby forming a fluid vessel.

302. Dispense etchant into vessel and onto substrate surface.

303. Generate at least one monitor beam in direction of substrate. Substrate is transparent to monitor beam.

304. Measure at least one property of the monitor beam and derive at least one substrate property therefrom. Etchant is transparent to monitor beam.

305. Generate radiation using etch-assist radiation emitter(s). Radiation passes through transparent substrate to an absorptive etchant whereby etchant is heated and local etch rate of substrate is increased.

306. Adjust radiation power and/or location to obtain desired etch shape.

307. Measure at least one property of monitor beam.

308. Does monitor beam property, as measured by camera, meet design specifications?          No

Yes

309. Optionally, move camera a known distance relative to substrate surface and measure at least one property of monitor beam using camera.

310. Optionally, calculate or use look-up table to determine if optical property of the measurement beam correctly correlates to shape of optical element (e.g., lens or parabolic reflector).

No          311. Does measured property meet design specifications?

Yes

312. Turn off etch-assist emitter(s) and monitor beam emitter(s). Remove substrate from etchant and rinse substrate in water.

Figure 3

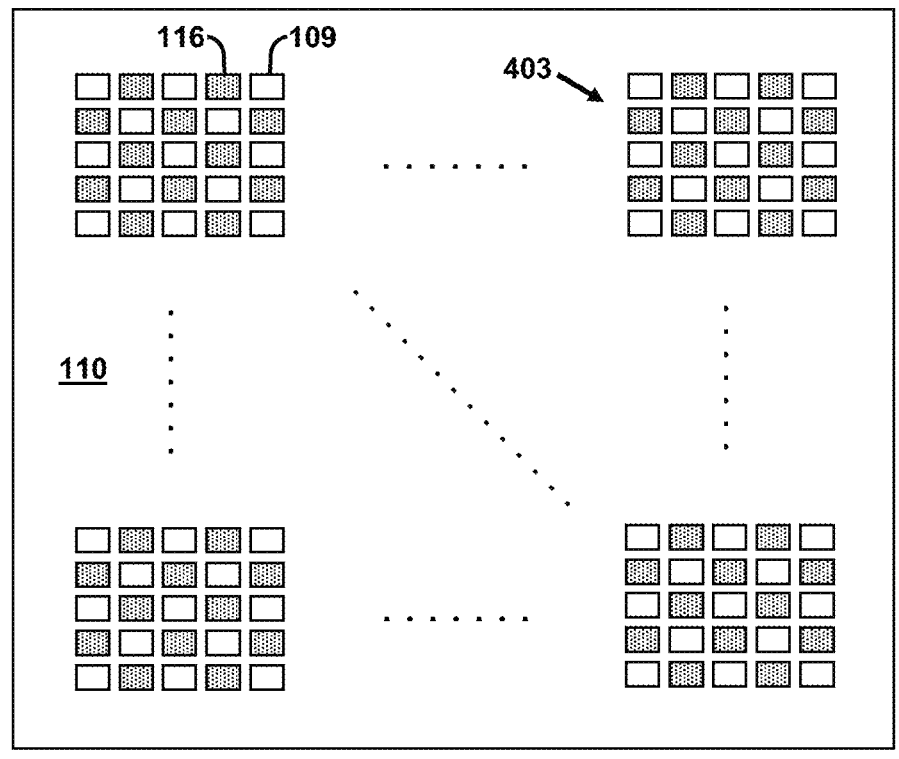
Figure 4A
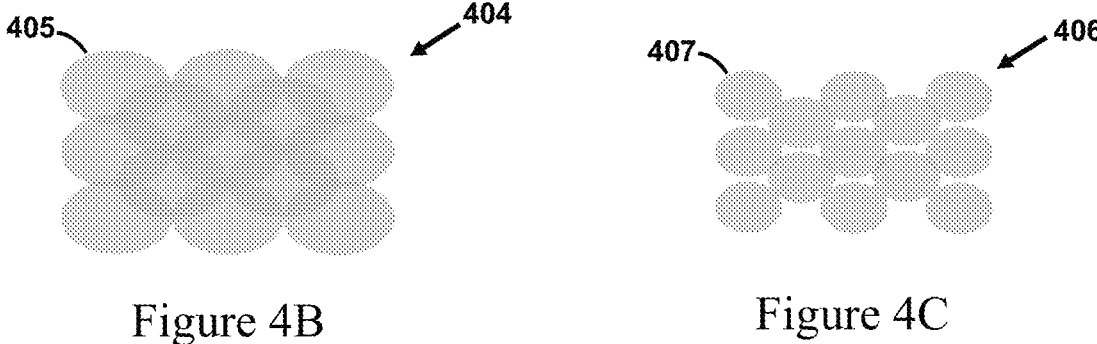
Figure 4B                    Figure 4C

THERMALLY GUIDED CHEMICAL ETCHING OF A SUBSTRATE AND REAL-TIME MONITORING THEREOF

BACKGROUND

The present invention relates, in general, to methods and an apparatus for processing a substrate. More specifically, the disclosure describes manufacturing processes using thermally-assisted chemical etching and real-time, closed-loop process control to precisely form optical elements from a substrate.

Manufacturing processes traditionally employed to machine optical elements (e.g. mirrors, flats, reflectors and lenses) are laborious and time-consuming, increasing the cost of these elements. Processes such as single-point diamond turning, multi-axis computer numerical control (CNC) machining, and grinding and polishing are protracted operations that typically allow only one or few optical elements to be machined at a time. Moreover, following the initial manufacturing process, the optical elements must be measured and tested to ensure compliance with design specifications. The manufacturing processes and ensuing metrology may need to be repeated multiple times to achieve a desired dimensional precision and surface quality, further extending the manufacturing time and cost.

SUMMARY OF THE INVENTION

A method of controlling a substrate etching process includes disposing a bottom surface or a top surface of a substrate adjacent to volume of etching fluid to produce an etchant-substrate interface and heating the etchant-substrate interface via spatially controlled electromagnetic radiation. The method also includes transmitting a monitoring beam through the substrate, the substrate and volume of etching fluid being at least partially transparent at the wavelength range of the monitoring beam and measuring a property of the substrate surface during the substrate etching process via the monitoring beam to produce a real-time measured property for the substrate. A corresponding etching system and computer-program product is also disclosed herein.

BRIEF DESCRIPTION OF THE DRAWINGS

Many aspects of the disclosed invention can be better understood with reference to the following drawings. The components in the drawings are not necessarily to scale, the emphasis instead being placed upon clearly illustrating the principles of the present invention. In the drawings, like reference numerals designate corresponding parts throughout the several views.

FIG. 3 is a flow chart depicting one example of a method for measuring the optical properties of an optical element under fabrication;

FIG. 4A shows a top view of multiple monitoring beam emitters interspersed between etch-assist emitters on an emitter support board;

FIG. 4B illustrates a cross-section of a radiation pattern generated by the etch-assist emitters of FIG. 4A;

FIG. 4C shows a radiation pattern at the bottom surface of the etchant after moving the etch-assist emitters of FIG. 4A closer to the etchant;

DETAILED DESCRIPTION OF THE INVENTION

The present invention recognizes the need to manufacture optical elements such as lenses with less expense and greater throughput. It is accordingly an object of the present invention to provide a simpler and less expensive method to fabricate optical components without the need for multiple rounds of machining and metrology.

The following description of the preferred embodiments is merely exemplary in nature and is not intended to limit the invention, its application, or uses. For example, while the disclosed invention may be used to create optical lenses, those skilled in the art of optical element manufacturing will be aware that other elements such as elliptical and parabolic reflectors may be fashioned using the disclosed methods. It should also be understood that the optical elements discussed herein may be used with various wavelengths of electromagnetic radiation, not limited to visible light.

The features exhibited in the embodiments may be combined with each other unless noted otherwise. Moreover, an embodiment containing a plurality of features should not be construed to mean that all those features are necessary for practicing the invention, as other embodiments may comprise less and/or alternative features.

Figure 1A:
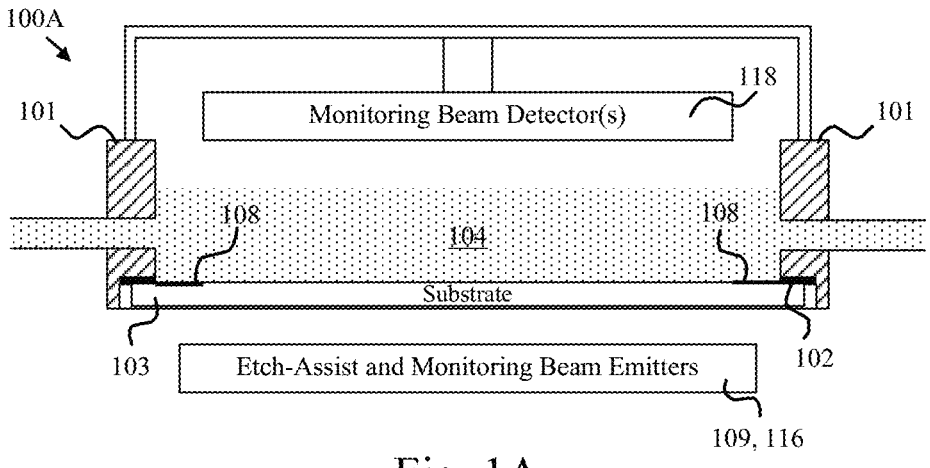
FIGS. 1A-1D illustrate an etching system wherein optical elements may be fabricated from a substrate using a localizable etch process.
Figure 1B:
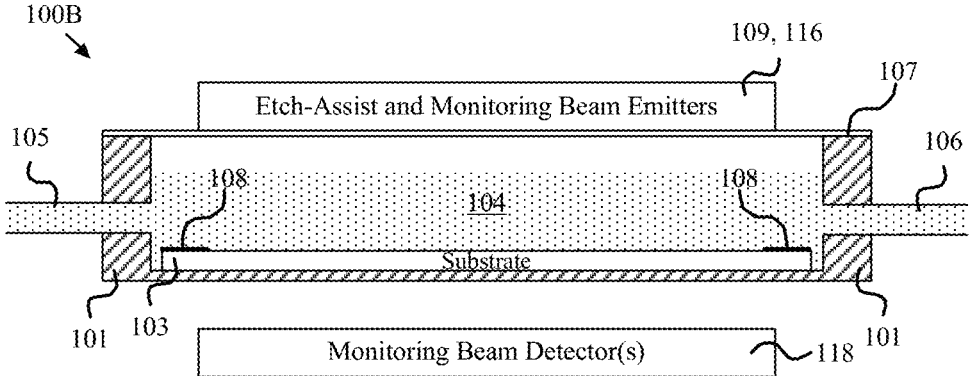
Figure 1C:
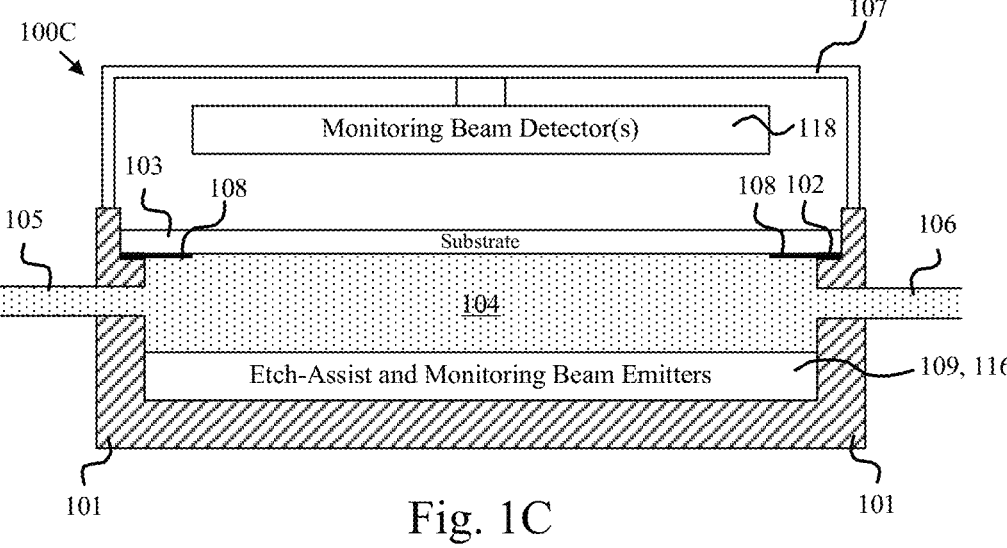
Figure 1D:
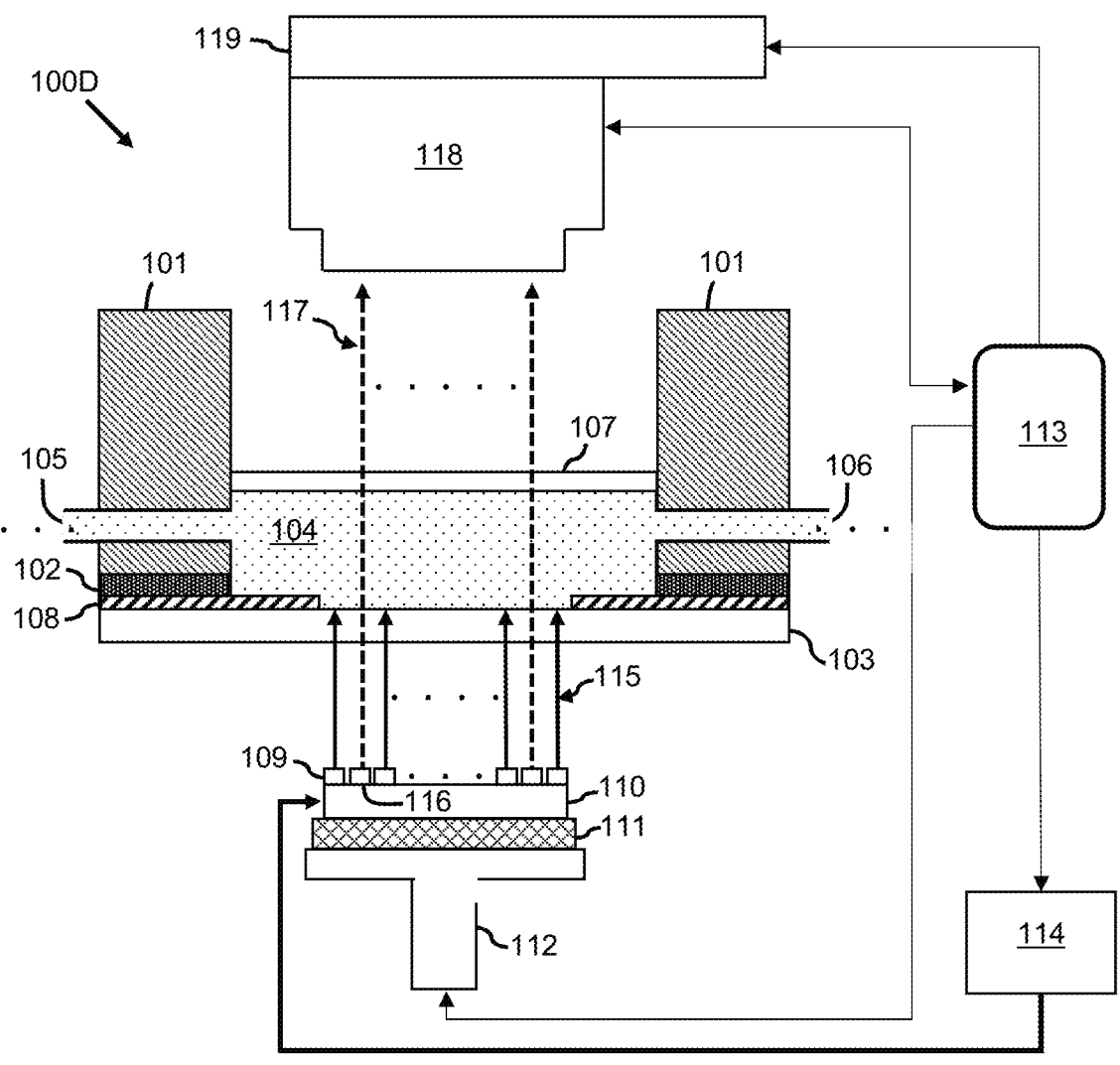

FIGS. 1A-1D illustrate an etching system 100 (i.e. 100A-D) wherein optical elements may be fabricated from a substrate 103 using a localizable etch process. The localized etch process may be monitored using optical measurement components. As shown in FIGS. 1A and 1D, a vessel wall 101 and a sealing element 102 such as a gasket may substantially encompass and be abutted to at least a portion of the surface of the substrate 103 forming a vessel for containing an etchant 104. The substrate 103 may be any number of solid materials such as glass, ceramic, semiconductor, crystal or rigid polymer. Preferably, the vessel wall material is substantially inert to the etchant 104, whereas the etchant reacts with the substrate 103 to remove material from the substrate surface. The vessel wall 101 may be covered with a cover 107 to form an enclosed vessel.

The depicted etchant 104 is a fluid such as a liquid, gas or plasma. The etchant 104 may be injected into the vessel through an inlet port 105 and may be removed from the vessel along with etched material via an outlet port 106. In some cases, multiple inlet and outlet ports may be used to transport the etchant. The ports may also be used to circulate the etchant 104 as desired. As shown in FIGS. 1C and 1D, respectively, the depth of the etchant 104 may be set by the location of the substrate 103 or a cover 107 sealed to the vessel wall 101. The cover 107 may be inert to the etchant 104.

In some embodiments, the etchant 104 is not covered with a cover 107. The etchant depth may be determined using a liquid depth measurement device including those commonly known within the art such as a hydrostatic pressure sensor, ultrasonic or laser time-of-flight sensor. The depth measurement device may be connected to a controller such as a computer or other digital processing apparatus to which the device can send measurement data.

In some embodiments, prior to sealing the substrate 103 to the vessel wall 101, a thin film 108 is disposed on the surface of the substrate and the thin film is patterned. The thin film 108 may be deposited using physical or chemical vapor deposition or oxidation of the substrate surface, and patterned using photolithography and chemical etching, as commonly performed within the semiconductor industry. The thin film 108 is preferably inert to the etchant 104 in order to prevent covered portions of the substrate 103 from being etched. In some cases, the thin film 108 is etched by the etchant 104 at a slower etch rate than the substrate 103 and may be completely removed from the substrate before the etch process is complete.

The depicted etching system 100 includes etch-assist emitter(s) 109, monitoring beam emitter(s) 116 and monitoring beam detector(s) 118. The etching system 100 enables placing the bottom surface or top surface of the substrate 103 adjacent to a volume of etching fluid (i.e., etchant 104) to produce an etchant-substrate interface. The etch-assist emitter(s) 109 are able to emit spatially controlled electromagnetic radiation (not shown in FIGS. 1A-C) that selectively heats the etchant-substrate interface and thereby spatially controls or guides the etching rate along the etchant-substrate interface.

The monitoring beam emitter(s) 116 transmit a monitoring beam (not shown in FIGS. 1A-C) through the substrate. The monitoring beam emitter(s) 116 may comprise an array of individual emitters. Examples of the monitoring beam emitter(s) 116 include lasers, light emitting diodes (LEDs), incandescent lamps, gas discharge lamps, fluorescent lamps, radio elements, and thermal radiation emitters such as filaments, thin film micro heaters and micro hotplates.

The substrate and volume of etching fluid may be partially or fully transparent at the wavelength range of the monitoring beam. The monitoring beam detector(s) 118 may measure a property of the substrate surface during the substrate etching process via the monitoring beam and thereby produce one or more real-time measured properties for the substrate. Examples of measured properties include focal length, focal spot size, 2D size and symmetry of the etched area, wavefront shape and phase, 3D profile of the etched area (e.g. curvature), and surface roughness. Additionally, these properties may be measured for monitoring beams having different wavelengths. The monitoring beam detectors(s) 118 may be an array of individual detectors or sensors. Examples of monitoring beam detector(s) include charge coupled devices, CMOS image sensors, wavefront sensors, antenna elements, scanning confocal microscopy devices, and interferometry devices.

In some embodiments, such as depicted in FIG. 1D, on one side of the substrate 103, opposite the etchant 104, a multiplicity of etch-assist emitters 109 are arranged in a two-dimensional array (described below) on an emitter support board 110. The emitter support board 110 may be in contact with a heatsink 111. The emitter support board 110 and heatsink 111 may reside on a positioner 112, the positioner being controlled by a controller 113 such as a computer or other digital processing apparatus. In some embodiments, the positioner 112 has three-axes of movement.

The etch-assist emitters 109 may comprise any number of radiation sources such as lasers, LEDs, masers, gyrotrons, backward wave oscillators, or radio elements. In the latter case, the radio elements are configured to emit millimeter wave radiation from 10 GHz to 300 GHz in the form of radiation beams. Still, in some cases, the emitters 109 are resistive heaters such as miniature filaments or wire coils, thin film metal traces, micromachined membranes through which an electrical current may be passed to create resistive heat, or thin film transparent conductors. The radiation generated by the resistive heaters may be broad spectrum radiation, and as such, a radiation filter (e.g., a bandpass or cutoff filter) may be used to limit the radiation spectrum emitted by the heat sources. Further still, the etch-assist emitters may be radiation sources comprised of plasmonic near-field transducers. In the case where the etchant is a liquid or gas, the wavelength of the etch-assist radiation may be highly absorbed by the etchant. Preferably the wavelength of the etch-assist radiation is at or near an absorption peak of the liquid or gas.

The etch-assist emitters 109 are individually controlled whereby the radiation power of each etch-assist emitter may be varied or select emitters may be turned off as desired. The controller 113 controls the etch-assist emitters 109 through a driver circuit 114 which supplies the etch-assist emitters with electrical power. An individual emitter may be selected using matrix addressing, as commonly used in semiconductor memory chips.

In some embodiments, the etch-assist emitters 109 are substantially Lambertian emitters that generate radiation 115 in a largely hemispherical pattern in a direction toward the substrate. In other embodiments, the etch-assist emitters are directional emitters that emit radiation in a highly directional manner. For example, the phase of the etch-assist emitters may be controlled to direct the emitted radiation toward a selected area via beam steering. Furthermore, the etch-assist emitters may be shaped in a manner, or comprise reflective elements, that increase(s) the directionality of the emitted radiation. For example, thermal emitters or patch antenna elements that are normally substantially Lambertian may be disposed within a parabolic reflective cavity that reflects radiation toward the substrate 103 in order to increase the directionality of the emitted radiation and the spatial selectivity of the etch process.

The radiation 115 may be continuous or quasi-continuous, in the case of the latter, the pulse duration is preferably longer than 10 μs. In some embodiments, one or more etch-assist emitters 109 produce radiation 115 having a wavelength different from the wavelength of the other emitters within the array. The substrate 103 is transparent to the emitted radiation allowing the radiation to pass through the substrate to the etchant 104 where the radiation is largely absorbed. The absorbed radiation is converted to heat thereby raising the local temperature of the etchant 104 and increasing the etch rate of the substrate 103. In some embodiments, nanoparticles that are highly absorptive of the radiation may be dispersed in the etchant to increase the conversion of electromagnetic energy to thermal energy.

By using an array of individually controllable etch-assist emitters 109 and adjusting the radiation power and location of the etch-assist radiation 115 incident on the etchant 104, the etch rate at specified areas of the substrate may be increased and material may be selectively removed from the substrate 103 thereby shaping the substrate surface. The precision of the etching process is determined by the ability of the etch-assist emitters 109 to heat a small volume of etchant 102 at a specified location, which, in turn, is determined by a variety of factors such as the radiation power, the areal size of the radiation incident on the etchant 104, whether radiation from adjacent emitters overlap at the etchant, the packing density of the emitters on the emitter support board 110, the temperature and inflow rate of the etchant, and the absorption coefficient of the etchant.

At the wavelength of the etch-assist emitters 109, the substrate 103 preferably has an absorption coefficient less than $0.1 \text{ cm}^{-1}$ and the etchant 104 preferably has an absorption coefficient greater than $1 \text{ cm}^{-1}$. For etchants with a water component, the wavelength of the etch-assist emitters 109 are preferably near any number of water absorption peaks in the ultraviolet (UV), infrared (IR) or radio frequency (RF) spectrum. For example, emitters with a wavelength of approximately 1940 nm (which corresponds to an absorption peak of water) may be used for etchants that comprise water such as a mixture of HF and water. The radiation absorbed by the etchant may be described by the Beer-Lambert law, $$I = I_o e^{-\alpha x},$$

where I is the radiation intensity at distance x from the surface of the etchant, $I_o$ is the radiation intensity incident on the etchant surface at x=0, and $\alpha$ is the linear absorption coefficient of the etchant. For an etchant with a linear absorption coefficient of $1 \text{ cm}^{-1}$ or greater, about 90% of the etch-assist radiation is absorbed within the first 2.3 cm of the etchant. Thus, one aspect of the invention described herein is to perform precise thermally-assisted chemical etching to machine a substrate 103. The invention may be used, for example, to etch a convex or concave shape within a glass substrate thereby forming an optical lens.

In other embodiments, the substrate 103 is opaque and the etchant 104, which is in contact with the substrate surface, is generally transparent at the wavelength of the etch-assist radiation 115 generated by the etch-assist emitters 109. In this case, the etch-assist radiation 115 is directed through the etchant 104 to the substrate surface. The substrate 103 absorbs the etch-assist radiation 115 and the substrate is heated according to the radiation intensity. At the wavelength of the etch-assist emitters 109, the substrate 103 preferably has an absorption coefficient greater than $1 \text{ cm}^{-1}$ and the etchant 104 preferably has an absorption coefficient less than $0.1 \text{ cm}^{-1}$. The etch-assist emitters 109 are arranged in an array and each emitter is individually controllable by the controller 113 through a driver circuit 114. By controlling the etch-assist radiation 115 from individual emitters within the array, select areas of the substrate 103 may be locally heated thereby increasing the etch rate of the substrate.

Furthermore, as illustrated in FIG. 1D the apparatus 100D enables an operator to monitor the surface of the substrate 103 in real-time during the etch process. On the emitter support board 110, monitoring beam emitters 116 generate monitoring beams 117 in the direction of the substrate. The substrate 103, etchant 104 and cover 107 are transparent at the wavelength of the monitoring beams 117, preferably having absorption coefficients less than $0.1 \text{ cm}^{-1}$. Consequently, at least a portion of the monitoring beams 117 pass through the substrate 103, etchant 104 and cover 107, and are incident on monitoring beam detector 118 which is/are positioned on the opposite side of the substrate 103 as the monitoring beam emitters 116. The monitoring beam detector 118 may comprise a camera that captures images of the monitoring beams 117 and sends the images to the controller 113 for processing and display. The controller 113 may control the position of the monitoring beam detector(s) 118 in three-dimensions using a robotic arm 119 and various operations of the monitoring beam detector(s) such as exposure, signal, gain and frame rate. The monitoring beam detector 118 may comprise one or more of a charge-coupled device (CCD) sensor, complementary metal-oxide semiconductor (CMOS) image sensor, an optical profiler, or a Shack-Hartmann wavefront sensor.

As the monitoring beams 117 pass through optical elements under fabrication within the substrate 103, beam characteristics such as location, intensity, cross-sectional diameter (i.e. spot size) and shape may change during the fabrication process. The beam characteristics are recorded by the monitoring beam detector(s) 118 and the images are sent to the controller 113 which then calculates various optical properties of the optical elements under fabrication. For example, collimated monitoring beams passing through the substrate 103 in which a convex lens is being etched will come to a focused spot at the focal length of the lens. To obtain a lens with a specific focal length, the monitoring beam detector(s) 118 may be moved to a location at a specific distance from the substrate 103, the desired focal length of the lens, and the etch process proceeds until a minimum monitoring beam spot size is recorded by the monitoring beam detector(s) 118 indicating the lens has the desired focal length.

In some embodiments, the monitoring beam detector(s) 118 may move in a direction normal to the substrate 103 surface using the robotic arm 119 to measure the spot sizes of the monitoring beams 117 at multiple distances from the substrate 103. These measurements may be used to calculate the incident angle θ of the monitoring beams 117 and the focal length f of an optical element such as a lens or parabolic reflector. By way of example, the optical properties of a lens may be measured using the following procedure. The spot size of a monitoring beam is measured at an image plane located a distance $z_1$ from the substrate 103 having a spot size diameter of $d_1$ and a second monitoring beam spot size is measured at an image plane further away from the substrate 103 at $z_2$ ($z_2>z_1$) having spot size diameter $d_2$. The incident angle $\theta$ of the monitoring beam 117 is calculated using the equation, $$\theta = \tan^{-1}\left(\frac{|d_1 - d_2|}{2} \cdot \frac{1}{z_2 - z_1}\right).$$

The focal length f may be calculated from the incident angle, assuming the monitoring beam spot size decreases to a negligibly small point at the focal length. For a light converging lens, $$f = z_2 + \frac{d_2}{2 \cdot \tan\theta},$$

and for a light diverging lens, the virtual focal length $f_v$ is, $$f_v = \frac{d_1/2 - z_1 \cdot \tan\theta}{\tan\theta}.$$

The ability to calculate, rather than measure, the focal length is necessary in situations where a lens has a focal length shorter than the depth of the etchant 104 such that the monitoring beam detector(s) 118 could not be moved to the focal point to measure the focal length directly or when a diverging lens is being fabricated and the virtual focal length cannot be measured directly.

It should be understood that the optical properties of the lens measured during the etch process are not equivalent to the optical properties of the lens in air. To determine the properties of the lens in air, a look-up table correlating measured properties of a lens in the disclosed etching apparatus to the properties of a lens in air may be used. Alternatively, if the refractive indices and thicknesses of the substrate 103, etchant 104 and cover 107 are known, Snell's law may be used to calculate the optical properties of the lens in air based on the optical measurements of the lens made during the etch process.

The monitoring beam detector(s) 118 also records a baseline intensity of the monitoring beam 117 passing through the substrate 103, etchant 104 and glass cover 107 before the etch process. As the etch commences, changes in monitoring beam intensity due to specular reflection from the surface of the substrate 103 may be used to infer information regarding the substrate's surface roughness.

The measured monitoring beam characteristics are used for closed-loop process control. The aforementioned monitoring beam measurements provide feedback on the progression of the surface etch to the controller 113 in real-time such that the controller may dynamically adjust the radiation power generated by individual etch-assist emitters 109 and the location of the emitters thereby modifying the etch process as needed. The controller 113 compares the measured optical properties of an optical element under fabrication to the design specifications for that optical element. The etch process may be adjusted manually by an operator or automatically by the controller 113 to bring the measured optical properties closer to the desired optical properties. For example, an optical lens with a desired focal length, numerical aperture, size, and shape may be machined within a substrate by comparing the measured optical properties of the lens with the design specifications of the lens and then using the computer to adjust the substrate etch to minimize the difference. Closed-loop feedback eliminates much post-fabrication metrology by performing the metrology during the manufacturing process thereby increasing manufacturing throughput and reducing optical element cost.

In some embodiments, a Shack Hartman wavefront sensor is used as the monitoring beam detector 118. The wavefront sensor may be used to measure the wavefront distortion of the monitoring beams 117 caused by the surface of the substrate as the monitoring beams pass through the substrate 103. The shape of the wavefront may be described mathematically using Zernike polynomials. The Zernike polynomials may be used to model optical aberrations in the optical elements under fabrication. The wavefront sensor may be used to monitor the etch process in real-time and provide process feedback to the controller 113, using the following cycle: first the controller 113 records the wavefront distortion during the substrate etch process using the wavefront sensors; second Zernike polynomials are used to model the wavefront; third, the computer adjusts the etch-assist radiation power and/or radiation location incident on the etchant to alter the substrate etch process and minimize the optical aberrations as modeled using Zernike polynomials; and, fourth the controller observes the changes to the wavefront as the substrate is etched using the new radiation power and/or location settings.

Those skilled in the art of lens design will recognize that many diverse optical elements may be fabricated using the methods and apparatus described herein. For example, spherical or aspherical lenses that focus or de-focus light may be machined. Furthermore, beam shaping lenses may be fabricated such as lenses that convert a monitoring beam with an elliptical two-dimensional cross-section to one with a circular shape. Freeform lenses in which a lens has no translational or rotational symmetry about an axis normal to the surface of the substrate 103 may also be fabricated. In some embodiments, the disclosed invention is used to fabricate a mold. For example, a concave trough may be etched into the substrate 103 and the trough is filled with a second material. In one aspect of the invention, the mold and the second material are used jointly as a single optical element having desirable chromatic and/or achromatic properties.

It should be noted that the apparatus disclosed herein may be used to fabricate optical elements on both sides of a substrate. For example, following the fabrication of an optical element on the first side of a substrate, the substrate is removed from the apparatus and cleaned. The side of the substrate without the optical element (i.e. the second side of the substrate) is abutted and sealed to a vessel wall and an etchant is injected onto the second substrate surface. In this case, the monitoring beam passes through the previously fabricated optical element and the monitoring beam detector records the central location of the monitoring beam. As the etching commences, the position of the etch-assist radiation may be adjusted such that the optical element under fabrication maintains the central position of the initial monitoring beam on the monitoring beam detector. Thereby the optical axis of the optical element fabricated on the second side of the substrate is aligned to the optical axis of the optical element fabricated on the first side of the substrate.

It should be noted that alternative arrangements of the parts of the apparatus 100D may exist without departing from the methods of the invention. For example, the etch-assist emitters 109 and monitoring beam emitters 116 may be placed above the substrate 103, and the etchant 104 may be sealed on the bottom side of the substrate 103. The monitoring beam detector(s) 118, in this embodiment, is placed on the opposite of the substrate as the monitoring beam emitters 116, below the etchant 104.

Figure 2:
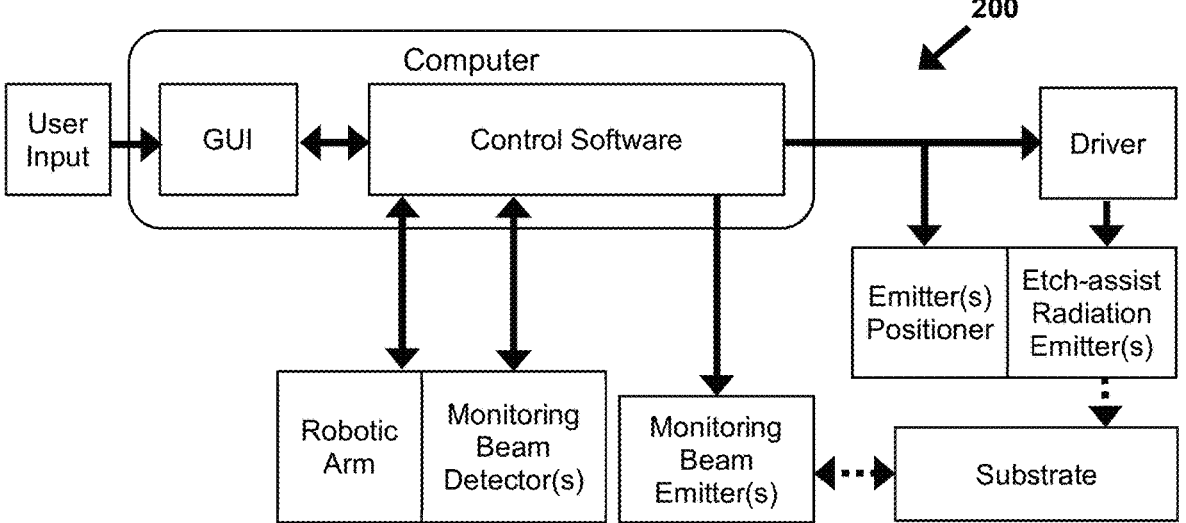
FIG. 2 is a block diagram showing additional aspects of the etching system of FIGS. 1A-1D.

FIG. 2 is a block diagram showing additional aspects of the etching system 100A-D. As shown, a user may interface with a software program to control a substrate etch process. The software program consists of a graphical user interface (GUI) through which a user may observe the monitoring beams as measured by the monitoring beam detector(s) and manually change the power supplied to individual etch-assist emitters and the position of the emitters (via the positioner) to adjust the substrate etch. In addition, the software program allows the user to manually adjust the monitoring beam detector(s) settings, move the monitoring beam detector(s) using the robotic arm and control the electrical power supplied to the monitoring beam emitters.

In some embodiments, a software program automatically controls the substrate etch process using feedback from the monitoring beam measurements to create an optical element matching the specifications input into the program by a user. For example, specifications for a lens may include focal length, minimum spot size to which the lens must focus light, the diameter of the lens, and a radius of curvature or a surface profile. The software program calculates the properties of the optical element under fabrication using the measured monitoring beam characteristics and compares the measured optical element properties to the user-defined specifications and minimizes the difference. The software program accomplishes this task by controlling the etch-assist emitter array which may entail changing the radiation power of individual etch-assist emitters 109, turning the etch-assist radiation 115 of some emitters off or moving the emitter array relative to the substrate 103 using the positioner 112. Many multivariate optimization algorithms, as known within the art, may be used to control the etch-assist emitter array and minimize the difference between the optical element specifications and measured optical properties of the optical elements.

In some embodiments, machine learning may be used to improve the etching process. For example, an artificial neural network using reinforcement learning may be used to dynamically adjust the inputs to the etch process (e.g. etch-assist radiation power and emitter location) in response to positive or negative reinforcement (i.e. a reward). The strength of the reinforcement is based on the difference between the calculated optical properties of the optical element under fabrication and user-specified optical properties of the optical element where actions that minimize the difference result in a positive reward.

Reference is now made to FIG. 3 which is a flow chart 300 showing a method for processing a substrate using the methods and apparatus disclosed herein. The method of FIG. 3 commences with the first step 301 of placing a substrate in contact with a vessel wall and sealing the substrate surface against the vessel wall thereby forming a vessel for containing an etchant. In step 302, the etchant is dispensed into the vessel onto the surface of the substrate. In step 303, a monitoring beam or multiple monitoring beams are generated and directed through the substrate to a monitoring beam detector(s) on the opposite side of the substrate. The substrate is substantially transparent at the wavelength of the monitoring beam. Next, in step 304, a computer uses the monitoring beam detector(s) to record a property of the monitoring beam. Monitoring beam properties such as diameter size, shape, intensity, and wavefront shape and phase may be recorded thereby gathering baseline measurements of the monitoring beam as the etching commences. Steps 301-304 are considered the initialization steps for setting up the fabrication process.

In step 305, an array of etch-assist emitters, each individually controllable, located on the opposite side of the substrate as the etchant direct radiation toward a multiplicity of selectable locations on the surface of the etchant at the substrate-etchant interface. The substrate is substantially transparent at the wavelength of the radiation. In step 306, the radiation power of select emitters is adjusted to selectively heat the etchant and form a target etch shape in the substrate. In step 307, at least one property of the monitoring beam (e.g. beam diameter size, shape, intensity, wavefront shape or wavefront phase) is measured as the substrate is etched. The feature etched in the substrate changes properties of the monitoring beam recorded by the monitoring beam detector(s). In step 308, if the property of the monitoring beam is not as desired (e.g. if the beam shape is asymmetric, the beam size is increasing in size rather than decreasing in size, or the wavefront is not shaped as desired), the radiation power from various etch-assist emitters may be adjusted to change the etching process by repeating steps 306 and 307.

In some cases, steps 309, 310, and 311 may be performed. As listed in step 309, the monitoring beam detector(s) is moved a predetermined distance from the substrate and the monitoring beam detector(s) records at least one property of the monitoring beam at the new location. In step 310, based on the change in at least one property of the monitoring beam, additional information about the optical element being formed in the substrate may be calculated (e.g. focal length of a lens). If the optical element does not possess the desired property, according to step 311, the etch process continues and the measurement of the monitor beam is repeated starting from step 307. Otherwise, once the desired monitor beam property has been achieved, the process is complete. In step 312, the etch-assist radiation and the monitoring beam are turned off. The etchant is then flushed from the vessel and the substrate is rinsed with water. In some embodiments, the etchant is flushed previous to each measurement of the monitor beam or other substrate related measurement and the vessel is refilled with etchant if the etching process is continued.

In some embodiments, more than one etch-assist emitter array is used to machine a substrate. FIG. 4A shows the top view of multiple monitoring beam emitters 116 interspersed between etch-assist emitters 109 on an emitter support board 110. The emitter support board 110 is a rigid, planar, platform, preferably a printed circuit board (PCB) with metal traces that provide electrical contacts to the monitoring beam emitters 116 and etch-assist emitters 109. It should also be noted that the monitoring beam emitters 116 and the etch-assist emitters 109 may be on different planes. For example, the monitoring beam emitters 116 may be recessed in the support board. The etch-assist emitters 109 and monitoring beam emitters 116 are arranged in two-dimensional patterns forming rectangular arrays 403 which are dispersed over the emitter support board 110. Each array 403 is used to etch different areas of a substrate whereby multiple etched shapes may be created simultaneously. In some embodiments, the surface of the emitter support board 110 is covered by a single large array. This large array may be configured into smaller arrays by turning off select etch-assist emitters thereby separating groups of emitters into active arrays separated by the deactivated emitters.

In one aspect of the invention, each of the monitoring beam emitters 116 may generate monitoring beams 117 having substantially identical wavelengths or a variety of different wavelengths. For example, the monitoring beam emitters 116 forming the array may comprise red, green or blue LEDs. By using a combination of wavelengths, the monitoring beam detector(s) can record how different wavelengths of light pass through the optical element under fabrication during the etch process. For example, a lens being fabricated may have different focal lengths for different wavelengths of light (i.e. a chromatic aberration). The monitoring beam detectors 118 may record the focal length at each wavelength of each monitoring beam 117. Furthermore, monitoring beam detectors may detect monitoring beams with different wavelengths by using filters. For example, a monitoring beam detector with a green bandpass filter may detect a green monitoring beam and another monitoring beam detector with a red bandpass filter may detect a red monitoring beam.

In some embodiments, the disclosed methods and apparatus are used to fabricate a multiplicity of optical elements concurrently on the surface of a substrate. A multiplicity of emitter arrays may be used to etch many optical elements over the area of the substrate in contact with the etchant. The optical elements may be identical or various types of optical elements may be fabricated throughout the substrate. In one case, a multiplicity of monitoring beams passes through the optical elements and the monitoring beam detector(s) moves to a position above each optical element to measure the optical properties of the optical elements. In other cases, a large monitoring beam may pass through multiple optical elements. The computer controls each etch-assist emitter in the arrays independently. The radiation from each etch-assist emitter may be adjusted based on the feedback from the monitoring beam as recorded by the monitoring beam detector(s), such that the etch process for each lens may be completed at substantially the same time. Thus, the etching process and feedback system described herein may be scalable to enable batch fabrication.

Completed optical elements are removed from the substrate through various means. For example, an individual optical element may be removed from the substrate by dicing or laser cutting. In some cases, optical elements may be removed from the wafer by disposing a barrier material on the substrate surface and patterning the barrier material. The substrate may then be etched using wet etching and/or dry etching at the openings in the barrier material, where the substrate is exposed, until the optical elements are freed from the substrate or held in the substrate with small tabs or bridges connecting the optical elements to the body of the substrate. The barrier material may then be selectively removed from the optical elements using a wet etchant that dissolves the barrier material without etching the optical elements.

In some embodiments, following fabrication of the optical elements, the substrate may be coated with at least one thin film to create an optical coating such as one or more anti-reflection, IR filter, and mirror coatings. In another aspect of the invention, the surface of the substrate is coated with a light-blocking thin film. The light-blocking thin film may be patterned to create an aperture on the optical elements within the substrate. The light-blocking thin film is patterned for example using photolithography and a lift-off process to remove the thin film, a process commonly performed within the semiconductor electronics industry. In some embodiments the light-blocking thin film may be used as the thin film barrier 108 during optical element fabrication. The thin film barrier 108 may be left on surface of the substrate following the fabrication of the optical elements thereby forming an aperture.

FIG. 4B illustrates a cross-section of the radiation pattern 404 generated by the etch-assist emitters 109 of FIG. 4A at a plane perpendicular to direction of radiation travel, the plane being at the substrate-etchant interface. The size and shape of the output radiation pattern 404 is for illustrative purposes as various sources of etch-assist radiation will have different cross-sectional profiles and radiation may diverge at a greater angle in one direction relative to another direction. The boundary of the radiation may be defined as the 1/e value of the maximum radiation intensity or the half power beam width where the power has fallen to −3 dB of the maximum power. The radiation from one etch-assist emitter 109 may overlap the radiation from adjacent etch-assist emitters. FIG. 4C shows a radiation pattern 406 at the bottom surface of the etchant after moving the etch-assist emitters 109 of FIG. 4B closer to the etchant. The surface area covered by the radiation 407 is smaller in FIG. 4C than the radiation in FIG. 4B as the radiation beams 407 diverge less over the shorter distance between the etch-assist emitters 109 and the substrate-etchant interface. It should be understood that the power density of a radiation beam 407 in FIG. 4C is greater than the power density of a radiation beam 405 in FIG. 4B.

Figure 5:
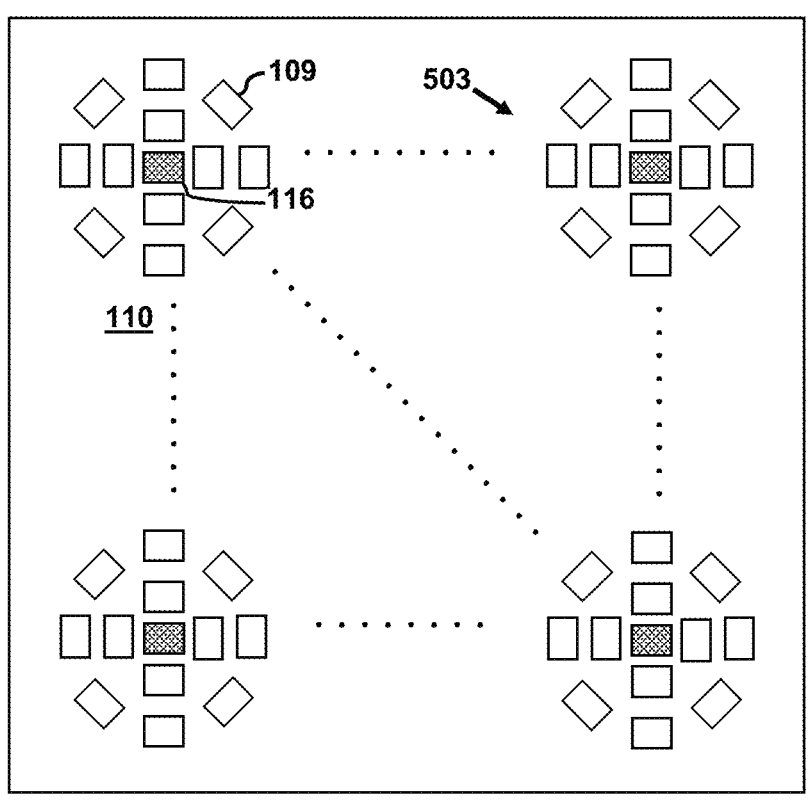
FIG. 5 shows an embodiment wherein etch-assist emitters are arranged in a circular pattern on an emitter support board.

FIG. 5 shows an embodiment of the invention wherein the etch-assist emitters 109 are arranged in a circular pattern 503 on an emitter support board 502. A single monitoring beam emitter 116 is used in this embodiment of the invention. The monitoring beam generated by the monitoring beam emitter may be collimated, or the beam may spread outward to cover an area substantially equal to the area covered by the radiation from the etch-assist emitters 501. In some embodiments, multiple monitoring beam emitters are interspersed throughout the etch-assist emitter array. A circular emitter array is useful for etching shapes with a circular outer boundary or radial symmetry such as a conventional lens.

Figure 6:
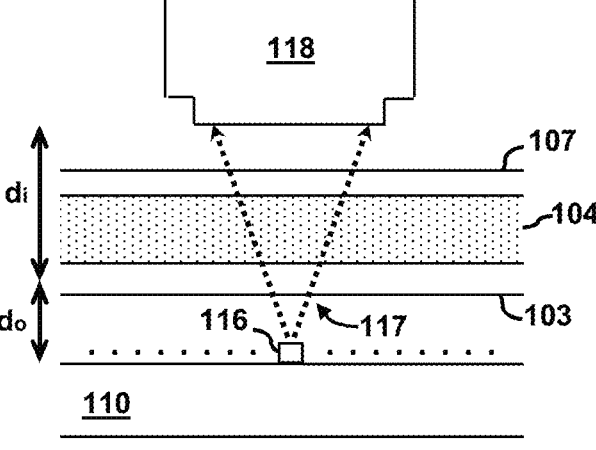
FIG. 6 shows a side view of monitoring beam emitters on an emitter support board used in the fabrication of an optical element.

FIG. 6 shows a side view of monitoring beam emitters 116 on an emitter support board 110 used in the fabrication of an optical element using the disclosed methods. Etch-assist emitters are not shown for clarity. The monitoring beams 117 generated by the monitoring beam emitters are uncollimated and diverge such that the beams cover substantially the entire area of the optical element under fabrication. The monitoring beams 117 pass through the transparent substrate 103, etchant 104 and cover plate 107 to the monitoring beam detector(s) 118. The monitoring beam emitters 116 are positioned at a known distance $d_o$ from the substrate 103 where $d_o$ is greater than the desired focal length f of an optical element under fabrication. In the case where the optical element is a converging lens, the Thin Lens Equation, $$\frac{1}{d_o} + \frac{1}{d_i} = \frac{1}{f},$$

may be used to find the distance $d_i$ (i.e. image distance) at which the monitoring beam detector 118 should be placed such that the monitoring beam emitters 116 will appear in focus when the lens under fabrication has obtained the desired focal length f. In other words, the monitoring beam detector is placed at the distance $d_i$ whereby the images of the monitoring beam emitters 116, as recorded by the monitoring beam detector 118, are sharpest when a lens has been fabricated having the desired focal length f.

In some embodiments, the monitoring beam emitters 116 are positioned at a distance from the substrate, equal to the desired focal length of a lens under fabrication. As the etch process proceeds, the monitoring beams 117 passing through the substrate begin to converge, eventually becoming collimated, indicating a lens with the desired focal length has been etched into the substrate. The monitoring beam detector 118 is used to determine when the beam is collimated by measuring the monitoring beam spot size at multiple distances from the substrate 103. Monitoring beam collimation is achieved when the spot size is substantially the same for each measurement.

It should be understood that the focal length of the lens as determined by the aforementioned methods is not equivalent to the focal length of the lens in air. To determine the properties of the lens in air, a look-up table correlating the measured focal length to the focal length of a lens in air may be used.

Figure 7:
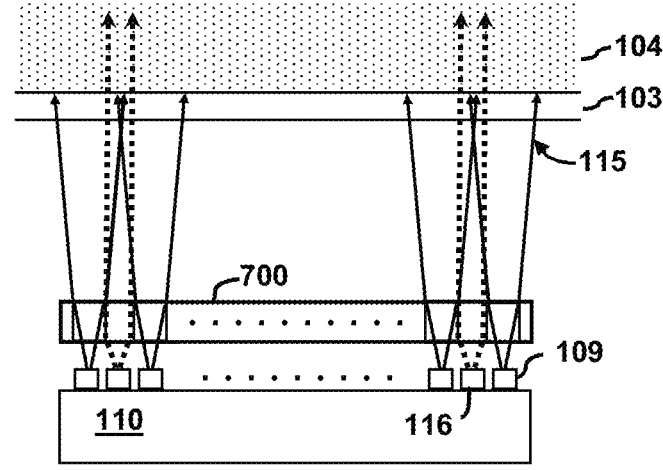
FIG. 7 illustrates an embodiment in which etch-assist radiation and monitoring beams are focused using a micro lens array (MLA)

FIG. 7 illustrates an embodiment of the invention in which the etch-assist radiation 115 and the monitoring beams 117 are focused using a micro lens array (MLA) 700. The etch-assist emitters 109 may be any number of radiative energy sources such as LEDs, vertical cavity surface emitting lasers (VCSELS), superluminescent light emitting diodes, diode-pumped solid-state (DPSS) lasers, semiconductor laser diodes, or laser-coupled optical fibers. The lenses within the MLA 700 are identical lenses and as such the lenses focus the etch-assist radiation 115 and the monitoring beams 117 differently as they have generally different wavelengths. In some embodiments, the MLA 700 may have two different lens types, one type for the etch-assist emitters 109 and one type for the monitoring beam emitters 116. In this case, the etch-assist emitters and the monitoring beam emitters may both be collimated.

Figure 8:
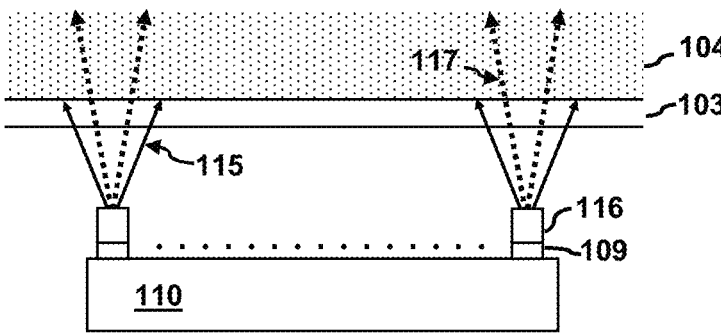
FIG. 8 illustrates an embodiment where the monitoring beam emitters are a second harmonic frequency of the etch-assist emitters.

In some embodiments, as depicted in FIG. 8, the etch-assist emitters 109 are lasers and the monitoring beam emitters 116 are created through a nonlinear process using the etch-assist radiation 115 that is output from the etch-assist emitters 109. For example, the etch-assist emitters may be diode lasers and the monitoring beam emitters 116 are DPSS lasers generated at a second harmonic frequency of the etch-assist emitters. The etch-assist radiation 115 and the monitoring beams 117 thus originate from substantially the same location on the emitter support board 110.

Figure 9:
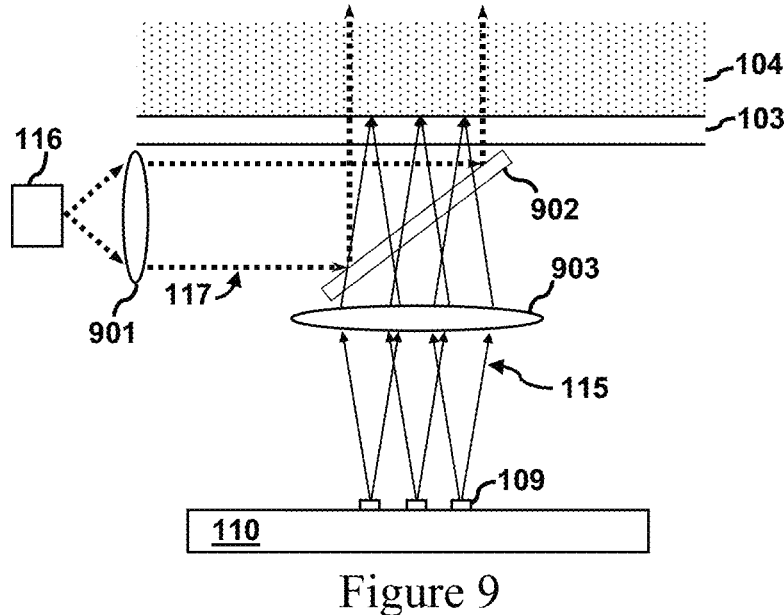
FIG. 9, depicts a monitoring beam emitter positioned adjacent to an emitter support board.

In some embodiments, as shown in FIG. 9, a monitoring beam emitter 116 is positioned adjacent to the emitter support board 110. The monitoring beam emitter 116 may be, for example, a LED, a laser diode, fiber-coupled laser, gas laser, VCSEL, or any other light source. A lens 901 collimates the monitoring beam 117 generated by the monitoring beam emitter 116. In the case where the monitoring beam emitter 116 is an optical fiber laser, the optical fiber may simultaneously carry several different wavelengths of light. The monitoring beam 117 is directed toward the substrate 103 by a dichroic mirror 902. Etch-assist emitters 109 are located on top of the emitter support board 110. A lens 903 above the etch-assist emitters focuses the etch-assist radiation 115 onto the etchant at the substrate-etchant interface. The etch-assist radiation 115 passes through the dichroic mirror 902 relatively unencumbered.

Figure 10:
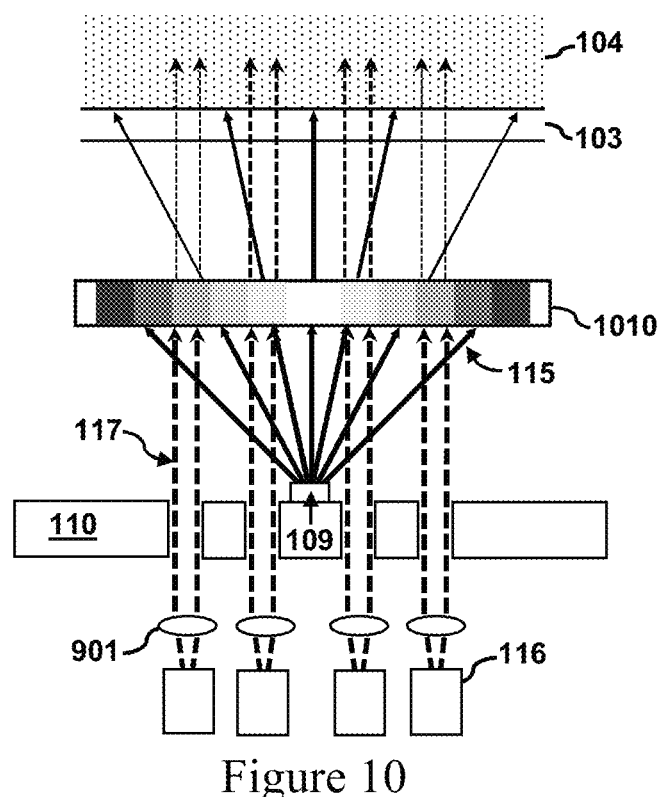
FIG. 10 illustrates etch-assist radiation that is spatially modulated by a screen having multiple electronically-controllable modulating elements.

FIG. 10 illustrates an embodiment of the invention wherein the etch-assist radiation 115 emanating from a single etch-assist emitter 109 is spatially modulated by a screen 1010 having multiple electronically-controllable modulating elements. The screen 1010 selectively prevents a varying amount of radiation from reaching the etchant 104 ranging from complete blockage (i.e. opaque) to generally having no effect on the intensity of the radiation (i.e. transparent). Preferably each modulating element is addressable by a computer having a user interface, through which an operator may input commands to the computer to control the transparency of the modulating elements. Thus, an operator may selectively block etch-assist radiation 115 from specific areas of the etchant 104 as needed for fabricating optical elements within the substrate 102. The thickness of the solid arrows shown in FIG. 10 represents the relative power of the etch-assist radiation 115, wherein thicker arrows represent higher power than thinner arrows. The monitoring beams 117 generated by monitoring beam emitters 116 may also be blocked to varying degrees by the screen 1010. The thickness of the dotted arrows represents the relative power of the monitoring beams 117, wherein thicker dotted arrows represent higher power than thinner dotted arrows. An optical measurement of the optical elements may be performed by temporarily making the screen 1010 transparent and allowing the monitoring beams 117 to pass through the screen 1010 relatively unencumbered. During this time, a monitoring beam detector(s) records the characteristics of the monitoring beams 117 passing through the optical elements under fabrication.

The screen 1010 may comprise any electronically controllable transmissive spatial light modulator such as a liquid crystal (LC) screen or liquid crystal display (LCD) with individually addressable elements (i.e. pixels), as commonly known within the art, or an electrochromic screen which undergoes a change in optical transparency in response to an applied electrical current or electric potential. In the case of an electrochromic screen, the screen is segmented into addressable elements.

In some embodiments, the etch-assist radiation 115 from at least one etch-assist emitter 109 and at least one monitoring beam 117 from at least one monitoring beam emitter 116 may be coupled into an optical fiber. In some cases, radiation, having different wavelengths, may be generated by more than one etch-assist emitter coupled into the optical fiber. Likewise, multiple monitoring beams with different wavelengths (e.g. red, green and blue) may be coupled into the optical fiber. The radiation emitter(s) and monitoring beam emitter(s) at the input side of the optical fiber are controlled using an electronic driver which is controlled by a computer. In some cases, a multiplicity of these optical fibers may be used to perform thermally-assisted chemical etching and etch monitoring according to the disclosed invention. In other cases, multiple optical fibers may be bundled together in a tube or ferrule and held in place using an epoxy. The optical fibers are terminated in the ferrule such that the ends of the fibers are at substantially the same plane in the ferrule.

Figure 11:
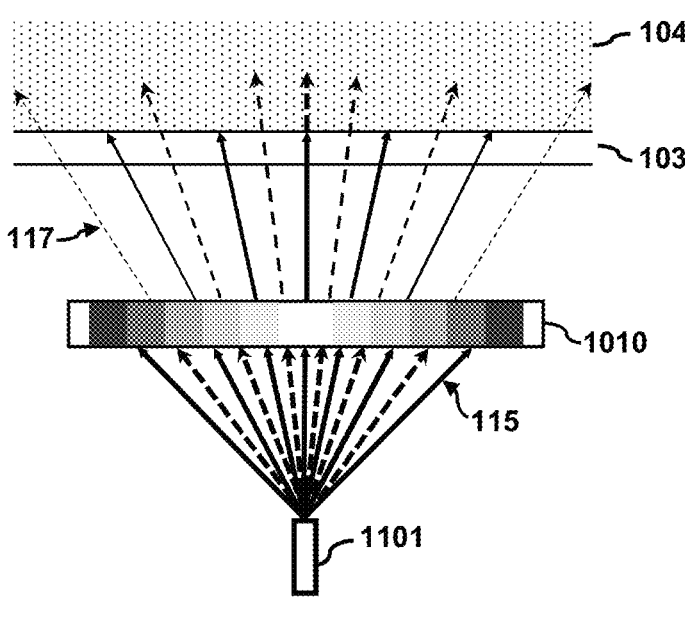
FIG. 11 illustrates an etching system with a radiation blocking screen.

FIG. 11 illustrates a configuration of the etching system wherein an optical fiber 1101 is used with a radiation blocking screen 1010. The thickness of the solid arrows represents the power of the etch-assist radiation 115, wherein thicker arrows represent relatively higher power than thinner arrows. Likewise, the thicker dotted arrows represent relatively higher power monitoring beams 117 than the thinner dotted arrows. The monitoring beams 117 may be allowed to pass through the screen 1010 momentarily unencumbered by electronically changing the entire screen to a transparent state. In some embodiments, a lens may be used to collimate or focus the etch-assist radiation 115 and monitoring beam 117 exiting the optical fiber 1101.

Figure 12:
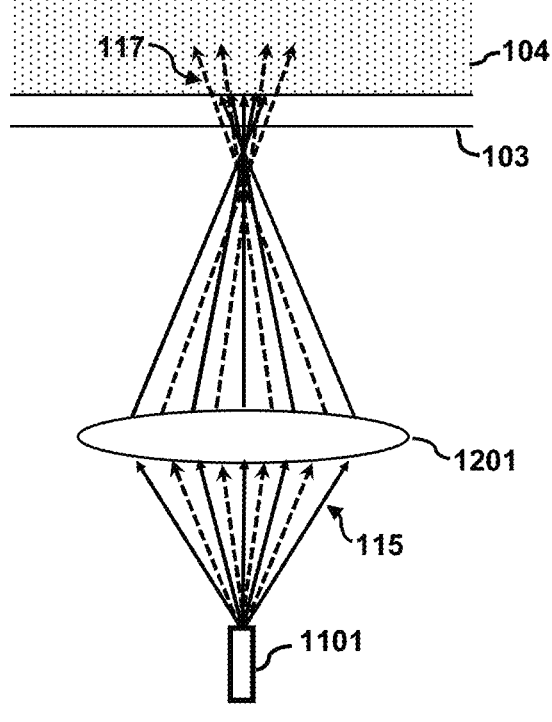
FIG. 12 depicts a moveable lens used to focus and defocus emitter-assist radiation and monitoring beam radiation.

In some embodiments, as illustrated in FIG. 12, an optical fiber 1101 and a moveable lens 1201 are used to focus and defocus the radiation and monitoring beam(s) exiting the optical fiber. The moveable lens 1201 moves closer or further from the optical fiber 1101 in a direction normal to the surface of the optical fiber to focus radiation on the etchant 104. Focused radiation incident on the etchant 104 has a higher power density and increases the etch rate of the substrate 103 more than defocused radiation. Thus, to form a concave optical element within the substrate 103, the moveable lens 1201 may focus the etch-assist radiation 115 to a small area on the etchant at the center of the optical element under fabrication to form the apex of a trough and then gradually, over time, defocus the radiation (by moving the lens relative to the etch-assist emitters) to controllably form the outer lateral edges of the concave shape. The lens may also be used to collimate the monitoring beams 117 for measuring certain properties of optical elements under fabrication as described above. The monitoring beams 117 are collimated for only a brief time, just long enough to perform an optical measurement. The etch-assist radiation emitters may be turned off momentarily during the time in which an optical measurement is taking place. Moreover, in some embodiments, the optical fiber 1101 moves relative to a fixed lens 1201 in two dimensions on a plane parallel to the lens. The optical fiber may additionally move rotationally about an imaginary center axis extending through the length of the optical fiber 1101.

In one case, the etch-assist radiation 115 from the lens 1201 is incident on at least one galvo scan mirror. The angular position of the galvo scan mirror(s) is controlled by a computer whereby the computer directs the etch-assist radiation incident on the mirror(s) to a desired location on the etchant.

Figure 13:
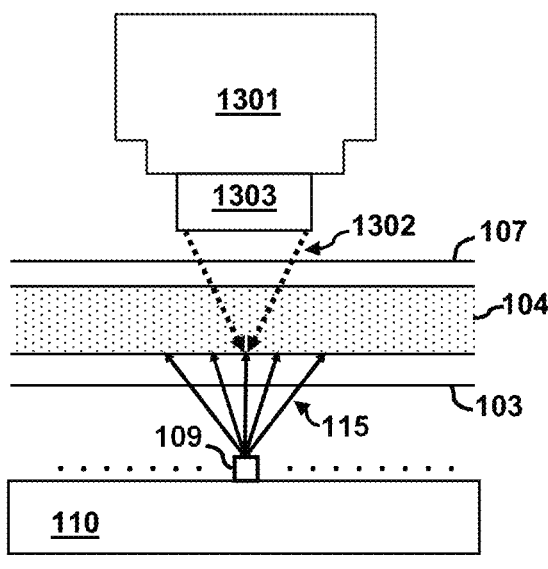
FIG. 13 illustrates an etching system wherein an optical profilometer is used to measure the surface profile of an optical element under fabrication.

In some embodiments, etch-assist emitters may be positioned on an emitter support board while the etch processes is monitored using a non-contact optical profilometer, the optical profilometer providing feedback to a controller which controls the etch-assist emitters. FIG. 13 illustrates a configuration of the etching system wherein the optical profilometer 1301 is used to measure the surface profile of an optical element under fabrication. The optical profilometer may use an incident radiation beam 1302 focused onto the surface of the substrate using an objective lens 1303. The etchant 104 and cover 107 are substantially transparent at the wavelength of the optical profilometer's incident beam. In some cases, the cover plate 107 is removed from the setup to prevent the profilometer's incident radiation beam 1302 from reflecting off the cover and interfering with the operation of the profilometer. In other cases, the cover plate 107 may have an anti-reflection coating to minimize reflected light from the profilometer's incident radiation 1302. Still, in other cases, a transparent liquid with a refractive index that substantially matches the cover plate may be injected onto the surface of the cover plate 107, and the objective lens 1303 of the profilometer may be submerged in the transparent fluid. Still, in other embodiments, the optical profilometer 1301 may comprise a transparent material-compensated objective lens and the optical profilometry may be performed by focusing an incident beam from the optical profilometer located on the side of the substrate 103 opposite the etchant 104 onto the surface of the substrate in contact with the etchant. For example, the objective lens may be glass-compensated in the case where the substrate is glass, enabling the profilometer to measure the machined surface of the substrate.

Figure 14:
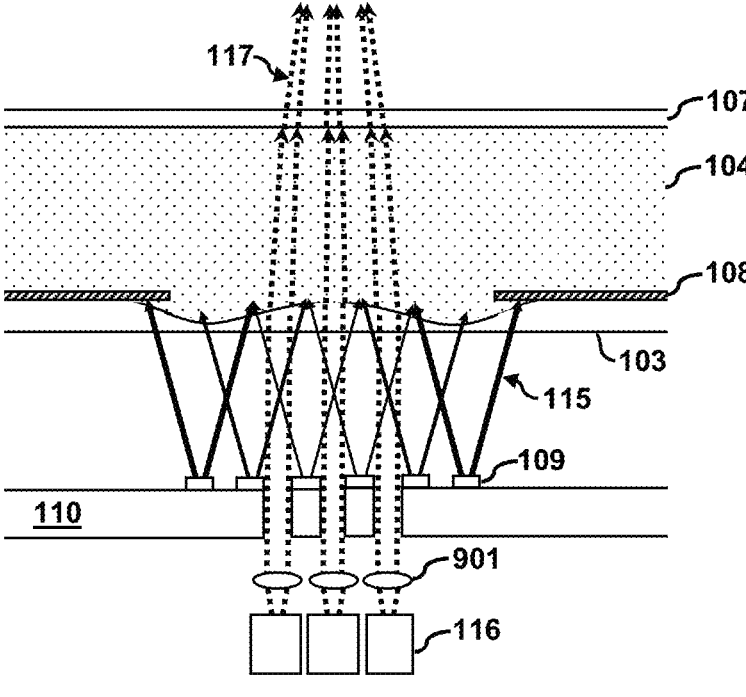
FIG. 14 is a cross-sectional side view of a convex lens being fabricated within a substrate where the output power of each etch-assist emitter is individually controlled.

The apparatus and methods described in this disclosure may be used to fabricate many types of optical elements. FIG. 14, by way of example, shows a cross-sectional side view of a convex lens being fabricated within a substrate 103. The output power of each etch-assist emitter 109 is individually controlled. The width of the solid arrows illustrates the power of the etch-assist emitters 109 whereby thicker arrows represent relatively higher power than thinner arrows. The radiation power of the lateral most etch-assist emitters 109 have higher output power than the center two emitters whereby the outer edges of the etch area are heated more than the center area creating a faster etch rate at the edges. A patterned thin film 108 is used to protect the areas of the transparent substrate outside of the etch area. Beneath the emitter support board 110 are several monitoring beam emitters 116 and optical lenses 901 that collimate the monitoring beams 117 generated by the monitoring beam emitters. The emitter support board 110 has openings extending through the top and bottom surfaces of the emitter support board whereby the monitoring beams 117 pass through the support board. The convex-shaped surface of the substrate 103 focuses the monitoring beams 117. As the etch progresses, the convergence location of the monitoring beams 117 typically moves closer to the substrate 103.

Figure 15:
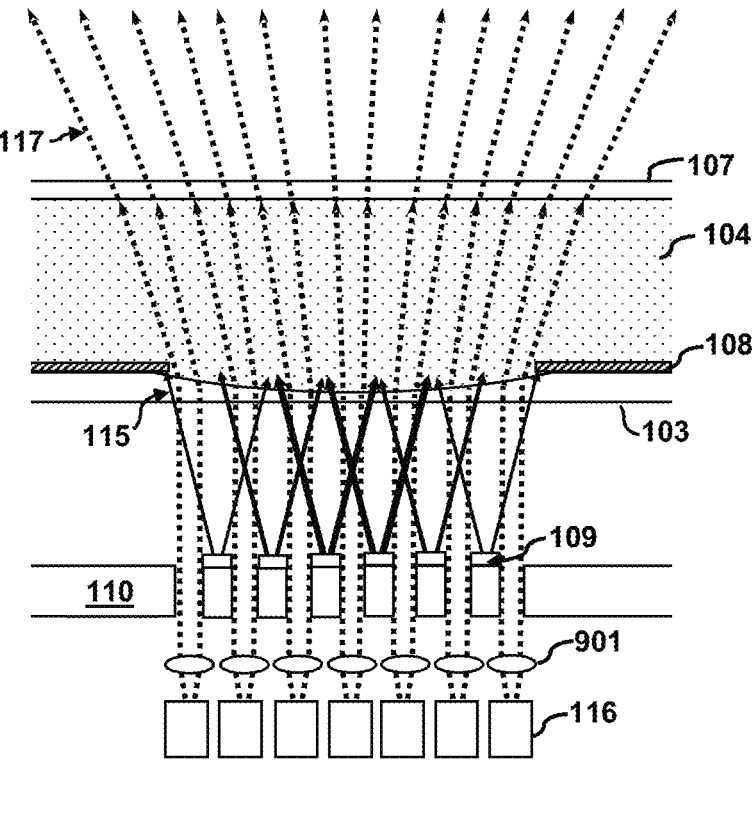
FIG. 15 is a cross-sectional side view of a concave lens being fabricated within a substrate where the output power of each etch-assist emitter is individually controlled.

FIG. 15, by way of example, shows a cross-sectional side view of a concave lens being fabricated within a substrate. The output power of each etch-assist emitter 109 is individually controlled. The width of the solid arrows illustrates the power of the etch-assist emitters 109 where thicker arrows represent relatively higher power than the thinner arrows. The radiation of the inner most etch-assist emitters has higher power than the radiation from the outer two emitters whereby the inner work area is heated more than the outer areas creating a faster etch rate at the center of the substrate 103. A patterned thin film 108 is used to protect the areas of the substrate 103 outside of the etch area. Beneath the emitter support board 110 are several monitoring beam emitters 116 with optical lenses 901 that collimate the output monitoring beams 117. The emitter support board 110 has openings extending through the emitter support board whereby the monitoring beams 117 pass through the support board. The monitoring beams 117 are defocused by the convex-shaped substrate 103 surface. As the etch progresses, monitoring beams 117 diverge from a virtual focal point on the underside of the substrate 103.

In some aspects of the invention, the substrate in FIG. 15 is used as a mold. After fabricating the concave trough, the substrate 103 is removed from the etchant, rinsed with water and cleaned. A glass preform or glob with a lower melting temperature than the substrate 103 is placed within the trough. The substrate 103 and preform are heated to the softening temperature of the preform. The preform may be pressed with a suitable force to distribute the preform within the trough such that the trough is filled by the preform. Afterward, the preform and substrate surfaces are planarized using chemical mechanical polishing (CMP).

In some cases, the substrate 103 and preform are heated to the melting temperature of the preform. The preform melts under the its own weight to fill the trough. The preform and substrate surfaces are then planarized using chemical mechanical polishing (CMP). The preform glass may remain in the mold whereby the mold and preform glass form a single optical element having planar surfaces. In some embodiments, the planar surfaces of the optical element may be used as a substrate for thin film transistors (TFTs), microelectromechanical systems (MEMS), organic light emitting diodes, transparent micro-heaters or electrodes, LEDs or any other opto-electro-mechanical device commonly known within the art.

Figure 16:
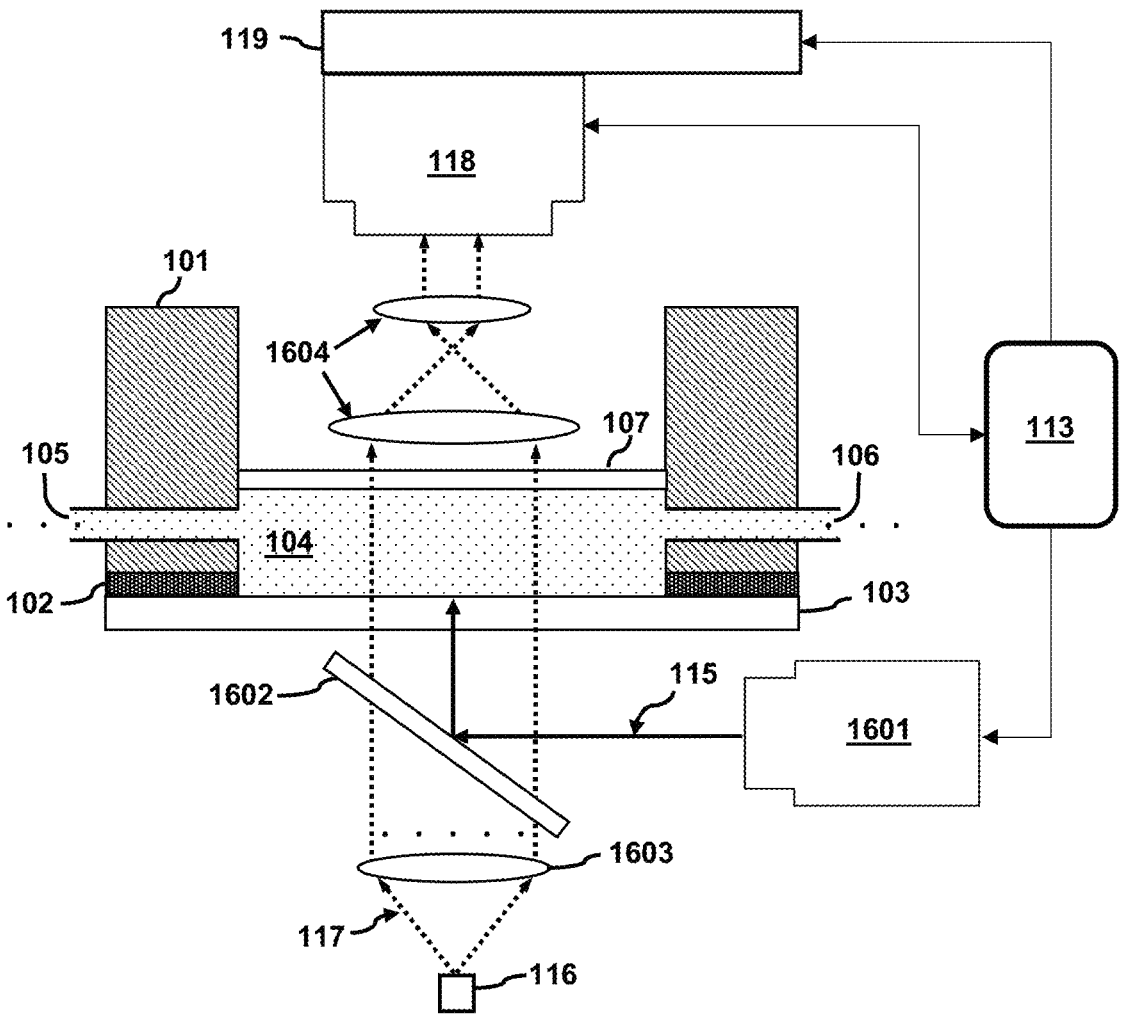
FIG. 16 depicts etch-assist radiation from a projector is directed by a dichroic mirror.

In another embodiment, the etch-assist radiation may emanate from a projector. For example, the projector may be a laser or LED projector as commonly known within the art. The projector may utilize a reflective LC screen such as a liquid crystal on silicon (LCOS) chip or a digital micro mirror device (DMD) for spatially modulating a laser beam or projecting a "scene" onto the etchant at the substrate-etchant interface. As illustrated in FIG. 16, etch-assist radiation 115 from a projector 1601 is directed by a dichroic mirror 1602 to the etchant 104. The projector comprises a focusing lens which is used to focus the etch-assist radiation 115 onto the substrate-etchant interface.

Below the dichroic mirror 1602 may be at least one monitoring beam emitter 109. The monitoring beam 117 generated by the monitoring beam emitter is collimated by a lens 1603. The collimated beam size is approximately the same areal size as the etch-assist radiation at the substrate 103. The collimated monitoring beam passes through the dichroic mirror 1602, substrate 103, etchant 104 and a cover plate 107 with relatively little absorption. On the side of the cover plate, opposite to the monitoring beam emitter(s), beam reducer lenses 1604 are used to decrease the size of the monitoring beam such that the monitoring beam is approximately the same size as a monitoring beam detector(s) 118, the detector also being on the side of the cover plate opposite the monitoring beam emitters. As an example, the beam reducer lenses 1604 may be comprised of two convex lenses that form a Keplerian beam reducer or a concave and convex lens forming a Galilean beam reducer. The monitoring beam detector(s) 118 may be comprised of a CCD or CMOS camera or a wavefront sensor such as a Shack-Hartmann wavefront (SHW) sensor.

In the case where the monitoring beam detector 118 is a wavefront sensor, three-dimensional optical profilometry of the substrate may be performed during the etch process. In general, the phase of an incident wavefront passing through a material is delayed by an amount proportional the material's thickness and refractive index (i.e. the optical path length). By comparing the phase of the wavefront incident on the material with the phase of the wavefront after passing through the material, one can calculate the material's thickness.

In the system described herein, the surface profile of the substrate 103 may be calculated by comparing the phase of the wavefront before etching has commenced (i.e. initial wavefront phase) with the measured phase of the wavefront after etching the substrate.

Referring again to FIG. 16, the monitoring beam 117 is collimated by a collimating lens 1602 creating a largely planar wavefront incident on the substrate. The wavefront at the substrate is relayed to the wavefront sensor by the beam expander lenses 1603. In other words, the wavefront at the exit pupil of the substrate is imaged onto the wavefront sensor. The controller 118 records the initial phase of the wavefront. As the substrate is etched, the initial wavefront phase is changed by the shape of the substrate. The phase of the wavefront after etching is measured by the wavefront sensor 118 and recorded by the controller 113. The controller is used to calculate the phase difference, $\Delta\phi(x,y)$, between the initial phase of the wavefront and the phase of the wavefront after etching. The 3D surface profile $z(x,y)$ of the substrate may be calculated using the equation, $$z(x, y) = \frac{\Delta\phi(x, y) \cdot \lambda/2\pi}{n_1 - n_2},$$

where $\lambda$ is the wavelength of the monitoring beam and $n_1$ and $n_2$ are the refractive indices of the substrate and etchant, respectively. The controller 113 may be used to calculate the surface profile using the above equation.

In some cases, the surface profile of the substrate 103 is only measured when the fluid vessel is filled with water. The etch process proceeds using the following cycle: first, the fluid vessel is filled with water; second a monitoring beam 117 is generated and directed through the dichroic mirror 1602, substrate 103, etchant 104, and cover 107; third, the wavefront at the exit pupil of the substrate is relayed to the wavefront sensor 118 and the controller 113 records the initial wavefront; fourth, the water is removed from the fluid vessel and etchant 104 is injected into the fluid vessel; fifth, etch-assist radiation 115 is projected onto the substrate-etchant interface for a specified time and the substrate 103 is controllably etched; sixth, the etch-assist radiation is turned off; seventh, the etchant 104 is removed from the fluid vessel and the vessel is filled with water; eighth, a new wavefront at the exit pupil of the substrate 103 is relayed to the wavefront sensor 118 and the controller 113 records the new wavefront; ninth, using the initial wavefront measurement and the new wavefront measurement, the surface profile of the substrate is calculated by the controller 113 and compared to a desired surface profile; tenth, based on the difference between the desired surface profile and the calculated surface profile, the power and/or location of the etch-assist radiation is adjusted; eleventh, the water is removed from the fluid vessel, replaced with etchant and the etch-assist radiation 115 is projected onto the substrate-etchant interface. The foregoing steps may repeat multiple times until the surface profile of the etched substrate is within tolerance of the desired surface profile.

Moreover, the controller 113 may be used to compare the measured surface profile to an ideal surface profile specified by a user. The difference between the specified and measured surface profiles may be used to change the location of the etch-assist radiation 115 incident on the etchant or turn off the etch-assist radiation at certain areas of the etchant-substrate interface. Hereby, the profile of the etched substrate may be controlled and the difference between the measured profile and the specified profile (i.e. the profile error) may be minimized. Thus, the measured surface profile may provide real-time feedback for controlling the etch process.

Figure 17:
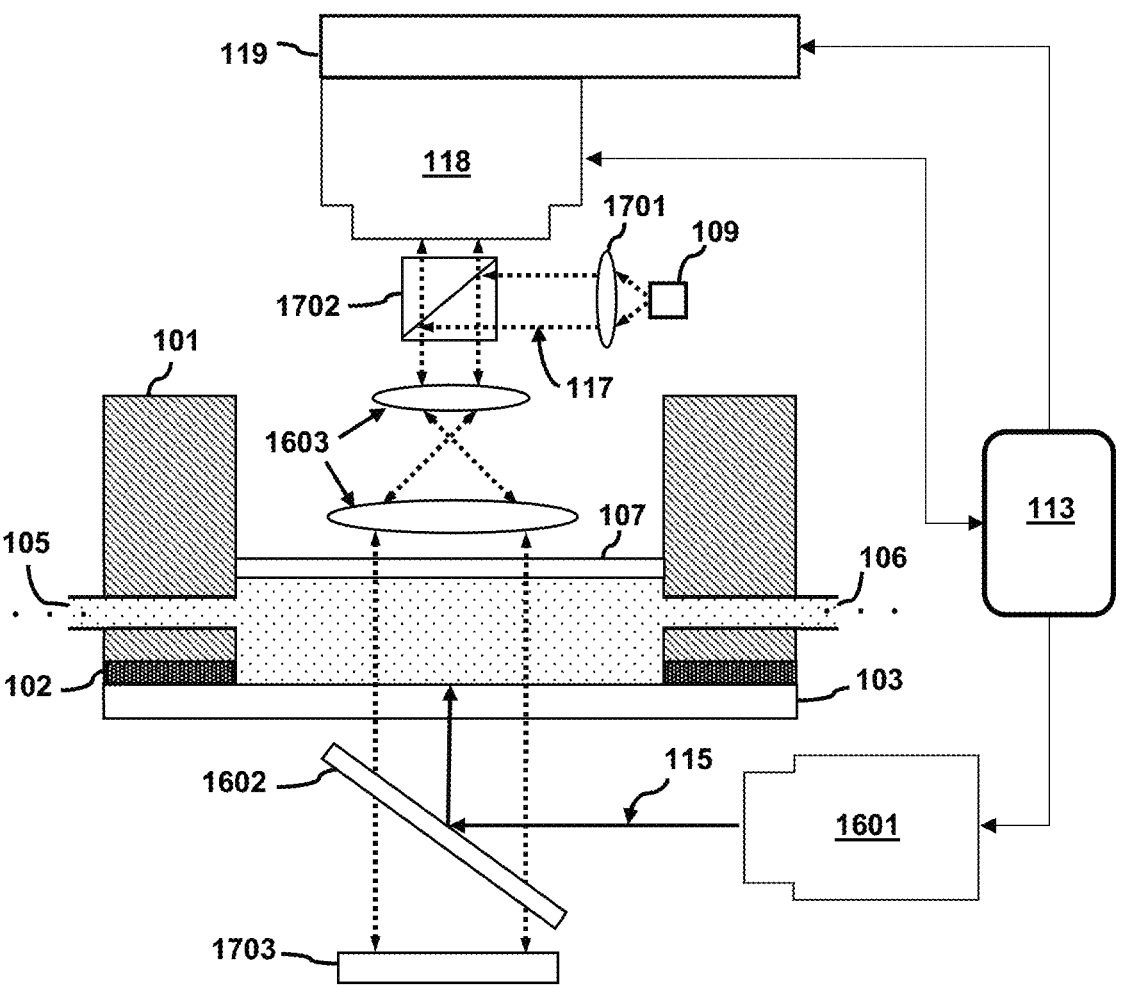
FIG. 17 depicts fabrication of a window or flat into a substrate.

In some aspects of the invention, a window or a flat may be fabricated in the substrate as illustrated in FIG. 17. A "double-pass" measurement using a wavefront sensor may be used to measure the flatness of the substrate 103 during processing. A monitoring beam emitter 109 generates a monitoring beam 117. The monitoring beam is collimated by a lens 1701 and the collimated beam is directed toward the substrate by a beam splitter 1702. The collimated beam is expanded by beam expander lenses 1603. The enlarged beam passes through the cover plate 107, etchant 104, substrate 103, and dichroic mirror 1602. A mirror 1703, substantially perpendicular to the collimated beam, reflects the collimated beam along the same path to a wavefront sensor 118. As long as the surface of the substrate is parallel to the mirror, the collimated beam 117 will trace the same path to the beam splitter 1702, where a portion of the beam will pass through the beam splitter and be incident on the wavefront sensor 118. The beam expander lenses 1603 relay the wavefront from the substrate 103 to the wavefront sensor 118 where the phase of the wavefront is measured and the surface profile of the substrate 103 can be calculated. The controller 113 uses the profile measurement to adjust the etch-assist radiation 115 emanating from the projector 1601 to maintain a flat surface on the substrate 103 such that the substrate surface remains parallel to the mirror 1703 surface.

Figure 18:
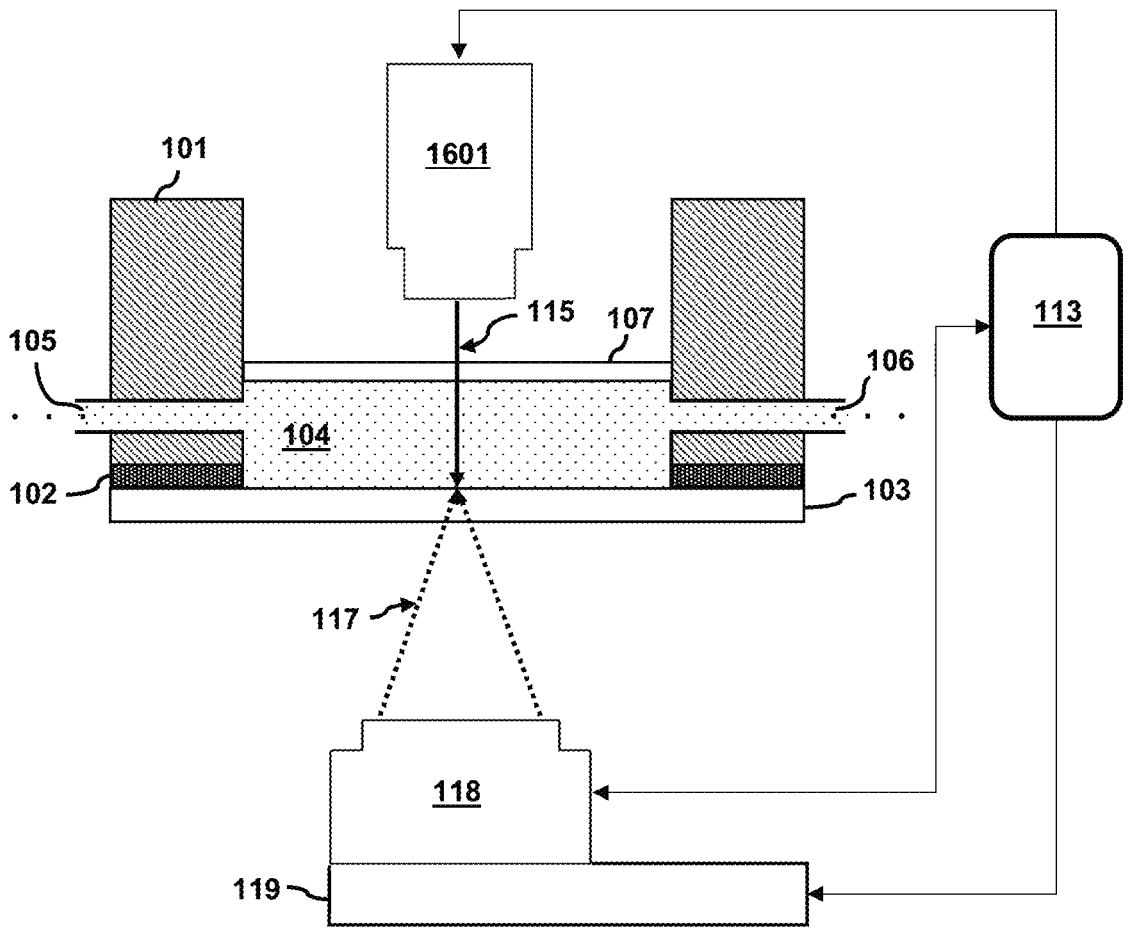
FIG. 18 depicts a projector that generates etch-assist radiation that passes through a cover plate and etchant and is focused onto the surface of a substrate where it is absorbed and converted to heat.

In another embodiment, the etchant and the cover plate are transparent to the etch-assist radiation and the substrate is highly absorbing of the etch-assist radiation. The substrate is locally heated, and thermal energy from the substrate accelerates the etch process. In this case, illustrated in FIG. 18, a projector 1601 generates etch-assist radiation 115 and the etch-assist radiation passes through the cover plate 107, and the etchant 104. The etch-assist radiation 115 is focused onto the surface of the substrate 103 where the radiation is absorbed and converted to heat. According to the radiation pattern emitted by the projector 1601, the etch may be spatially controlled. Opposite the projector, on the other side of the substrate, a monitoring beam detector or profilometer 118 may be used to measure at least one property of the substrate 103. For example, vertical scanning interferometry or scanning laser confocal microscopy may be used to measure the surface profile of the substrate 103 during etching. The substrate 103 is transparent to the monitor beam 117 of the monitoring beam detector or profilometer 118. Using the profile measurement, a computer 113 may compare the measured surface profile to an ideal surface shape specified by a user and the difference between the specified and measured shape can be used to modify the position and intensity of etch-assist radiation 115 incident on the substrate by controlling the radiation emanating from the projector 1601 thereby correcting profile errors.

As the embodiments of the invention presented above and other variations and combinations of the features previously discussed can be utilized without departing from the present invention, the foregoing description of the preferred embodiments should be taken by way of illustration rather than by way of limitation of the invention as defined by the claims.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the preceding description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The description of elements in each figure may refer to elements of proceeding figures. Like numbers refer to like elements in all figures, including alternate embodiments of like elements. The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for controlling a substrate etching process, the system comprising:
  a volume of etching liquid;
  a substrate receiver configured to receive and hold a substrate adjacent to the volume of etching liquid to produce an etchant-substrate interface;
  an etch-assist emitter configured to provide spatially controllable electromagnetic radiation to the etchant-substrate interface and selectively heat the etchant-substrate interface, wherein the substrate is interposed between the etching liquid and the etch-assist emitter and is at least partially transparent to the spatially controllable electromagnetic radiation such that at least a portion of the spatially controllable electromagnetic radiation passes through the substrate to be at least 90% absorbed by the etching liquid within the first 3 centimeters ("cm") of the etching liquid;
  a monitoring beam emitter configured to transmit a monitoring beam through the substrate;
  a monitoring beam detector configured to measure a property of a surface of the substrate during the substrate etching process via the monitoring beam to produce a real-time, measured property for the substrate; and
  a controller configured to adjust the spatially controllable electromagnetic radiation via the etch-assist emitter responsive to the measured property for the substrate to provide electromagnetic radiation that is greater in some areas of the etchant-substrate interface than other areas of the etchant-substrate interface.

2. The system of claim 1, wherein the controller is further configured to receive the property of the substrate and control the etch-assist emitter to achieve a desired surface profile for the etchant-substrate interface.

3. The system of claim 1, further comprising an etching vessel configured to retain the volume of etching liquid.

4. The system of claim 3, wherein the substrate encloses the etching vessel.

5. The system of claim 1, wherein the monitoring beam emitter comprises one or more of a laser, a maser, an LED, an incandescent lamp, a gas discharge lamp, a fluorescent lamp, a radio element, and thermal radiation emitters such as filaments, thin film micro heaters and micro hotplates.

6. The system of claim 1, wherein the monitoring beam detector comprises one or more of a charge coupled device, a CMOS image sensor, a wavefront sensor, a scanning confocal microscopy device, an antenna array and an interferometry device.

7. The system of claim 1, wherein the monitoring beam detector is configured to measure a phase of a wavefront passing through the substrate.

8. The system of claim 1, wherein the etching liquid comprises a mixture of water and hydrofluoric acid.

9. The system of claim 8, wherein the spatially controllable electromagnetic radiation has a wavelength of approximately 1940 nanometers ("nm").

10. The system of claim 1, wherein:
  the system further comprises a two-dimensional array of individually controllable monitoring beam emitter elements;
  the monitoring beam emitter comprises a monitoring beam emitter element of the two-dimensional array;
  the monitoring beam comprises a plurality of monitoring beams; and
  each monitoring beam emitter element is configured to transmit at least one monitoring beam of the plurality of monitoring beams through the substrate.

11. The system of claim 10, wherein the monitoring beam detector is further configured to measure a set of localized measurements of the property to produce a set of localized, real-time measured properties for the substrate and the controller is further configured to adjust the spatially controllable electromagnetic radiation responsive to the set of localized, real-time measured properties.

12. The system of claim 11, wherein the etch-assist emitter further comprises a two-dimensional array of individually controllable etch-assist emitter elements and the controller is further configured to adjust the spatially controllable electromagnetic radiation via the etch-assist emitter by independently modulating power delivered to each etch-assist emitter element of the two-dimensional array in response to the set of localized, real-time measured properties for the substrate.

13. The system of claim 10, wherein the two-dimensional array of individually controllable monitoring beam emitter elements comprises an array of light-emitting diodes (LEDs).

14. The system of claim 13, wherein a first LED of the array of LEDs is configured to emit light having a first wavelength and a second LED of the array of LEDs is configured to emit light having a second wavelength different from the first wavelength.

15. The system of claim 14, wherein the monitoring beam detector is configured to record a focal length for the substrate at the first wavelength and a focal length for the substrate at a second wavelength.

16. The system of claim 15, wherein the monitoring beam detector comprises an array of individual monitoring beam detectors.

17. The system of claim 16, wherein:
the array of individual monitoring beam detectors comprises a plurality of bandpass filters;
a first bandpass filter of the plurality of bandpass filters corresponds to the first wavelength; and
a second bandpass filter of the plurality of bandpass filters corresponds to the second wavelength.

18. The system of claim 1, further comprising a light-blocking film coating a surface of the substrate, wherein the light-blocking film is substantially inert to the etching liquid.

19. The system of claim 18, further comprising a plurality of optical elements within the substrate, wherein the light-blocking film is patterned to include at least one aperture positioned over at least one optical element of the plurality of optical elements.

20. The system of claim 19, wherein the etch-assist emitter is configured to provide spatially controllable electromagnetic radiation to a first portion of the substrate and the light-blocking film covers a second portion of the substrate different from the first portion.

* * * * *